(12) United States Patent
Finney et al.

(10) Patent No.: US 12,431,886 B2
(45) Date of Patent: Sep. 30, 2025

(54) ELECTRONIC CIRCUIT WITH A TRANSISTOR DEVICE AND A CLAMP CIRCUIT AND METHOD

(71) Applicant: Infineon Technologies Austria AG, Villach (AT)

(72) Inventors: Adrian Finney, Villach (AT); Oliver Blank, Villach (AT); Gerhard Prechtl, Rosegg (AT); Dirk Ahlers, Munich (DE); Gerhard Nöbauer, Villach (AT); Marius Aurel Bodea, Villach (AT); Joachim Schönle, Villach (AT); Oliver Häberlen, Villach (AT)

(73) Assignee: Infineon Technologies Austria AG, Villach (AT)

( * ) Notice: Subject to any disclaimer, the term of this patent is extended or adjusted under 35 U.S.C. 154(b) by 82 days.

(21) Appl. No.: 18/446,610

(22) Filed: Aug. 9, 2023

(65) Prior Publication Data

US 2024/0072785 A1 Feb. 29, 2024

(30) Foreign Application Priority Data

Aug. 31, 2022 (EP) .................................... 22193343

(51) Int. Cl.
*H03K 17/06* (2006.01)
*H03K 17/081* (2006.01)
*H03K 17/10* (2006.01)

(52) U.S. Cl.
CPC ..... *H03K 17/063* (2013.01); *H03K 17/08104* (2013.01); *H03K 17/102* (2013.01)

(58) Field of Classification Search
None
See application file for complete search history.

(56) References Cited

U.S. PATENT DOCUMENTS

| | | | | |
|---|---|---|---|---|
| 6,169,439 B1* | 1/2001 | Teggatz | ............ | H03K 17/0822 327/309 |
| 6,600,356 B1* | 7/2003 | Weiss | .................. | H01L 27/0259 327/310 |
| 7,593,204 B1* | 9/2009 | Iversen | .................. | H02H 9/046 361/56 |
| 7,679,870 B2* | 3/2010 | Lin | ...................... | H01L 27/0285 361/111 |
| 8,975,940 B2* | 3/2015 | Hayashi | .................... | H03L 5/00 327/321 |

(Continued)

*Primary Examiner* — Kenneth B Wells
(74) *Attorney, Agent, or Firm* — Murphy, Bilak & Homiller, PLLC

(57) ABSTRACT

An electronic circuit and a method are disclosed. The electronic circuit includes: a first transistor device having a load path between a first load path node and a second load path node; and a clamping circuit connected to the load path of the first transistor device. The clamping circuit includes: a second transistor device having a load path connected in parallel with the load path of the first transistor device, and a control node; and a drive circuit configured to drive the second transistor device. The drive circuit includes a clamping element and a resistor connected in series between the first and second load path nodes of the first transistor device. The drive circuit is configured to drive the second transistor device dependent on a voltage across the resistor. The first transistor device and the clamping circuit are integrated in a same semiconductor die.

14 Claims, 13 Drawing Sheets

(56) References Cited

U.S. PATENT DOCUMENTS

| | | | |
|---|---|---|---|
| 9,531,263 B2* | 12/2016 | Hayashi | H03K 17/0822 |
| 10,217,734 B2* | 2/2019 | Fukuhara | H02H 9/04 |
| 10,438,940 B2* | 10/2019 | Hill | H01L 27/0255 |
| 10,763,845 B2* | 9/2020 | Wada | H03K 17/0822 |
| 10,937,781 B1* | 3/2021 | Roig-Guitart | H01L 27/0255 |
| 11,128,117 B2* | 9/2021 | Takahashi | H01L 27/0255 |
| 11,398,470 B2* | 7/2022 | Guan | H01L 27/0292 |
| 11,600,610 B2* | 3/2023 | Guan | H01L 27/0266 |
| 2014/0085760 A1 | 3/2014 | Lui | |
| 2018/0167000 A1 | 6/2018 | Pidutti et al. | |
| 2019/0260371 A1 | 8/2019 | Wada et al. | |
| 2019/0393693 A1 | 12/2019 | Shibib et al. | |
| 2020/0365581 A1 | 11/2020 | Guan et al. | |
| 2021/0210481 A1 | 7/2021 | Guan et al. | |

* cited by examiner

ELECTRONIC CIRCUIT WITH A TRANSISTOR DEVICE AND A CLAMP CIRCUIT AND METHOD

TECHNICAL FIELD

This disclosure relates in general to an electronic circuit with a transistor device and a clamp circuit.

BACKGROUND

Power transistor devices are widely used as electronic switches in various types of electronic circuits. In a typical application, a load path of the transistor device is connected in series with a load and the transistor device switches on and off dependent on a drive signal received at a drive input. In this type of circuit, a maximum level of a load path voltage across the load path is basically defined by the supply voltage. However, due to parasitic effects voltage spikes of the load path voltage may occur during a transition of the transistor device from an on- state (switched-on state) to an off-state (switched-off state). Such voltage spikes may significantly exceed the supply voltage. Parasitic effects that may cause voltage spikes include, for example, inductances of connection lines between the load path of the transistor device and the load and between the load path of the transistor device and a voltage source providing the supply voltage. The faster the transistor device switches from the on-state to the off-state, the higher these voltage spikes. Another example which can cause voltage spikes is ESD (Electrostatic Discharge) events.

Voltage spikes higher than a voltage blocking capability of the transistor device, which is the maximum voltage the transistor device can block, may destroy or degrade the transistor device. The transistor device can be designed such that its voltage blocking capability is higher than the supply voltage and adapted to the voltage spikes that may occur. However, conduction losses and, last but not least, the price of transistor devices increase as the voltage blocking capability increases.

Examples of power transistor devices include, but are not restricted to, insulated gate power transistor devices such as MOSFETs (Metal Oxide Semiconductor Field-Effect Transistor) or HEMTs. MOSFETs may be implemented based on silicon (Si) or silicon carbide (SiC) and HEMTs may be implemented based on gallium nitride (GaN), for example.

There is a need to protect a transistor device from voltage spikes, such as voltage spikes that may occur during a transition of the transistor device from one operating state to another operating state, in particular, during a transition from the on-state to the off-state.

SUMMARY

One example relates to an electronic circuit. The electronic circuit includes a first transistor device with a load path between a first load path node and a second load path node, and a clamping circuit connected to the load path of the first transistor device. The clamping circuit includes a second transistor device with a load path connected in parallel with the load path of the first transistor device and a control node, and a drive circuit configured to drive the second transistor device. The drive circuit includes a clamping element and a resistor connected in series between the first and second load path nodes of the first transistor device. The drive circuit is configured to drive the second transistor device dependent on a voltage across the resistor. Furthermore, the first transistor device and the clamping circuit are integrated in the same semiconductor die.

BRIEF DESCRIPTION OF THE DRAWINGS

Examples are explained below with reference to the drawings. The drawings serve to illustrate certain principles, so that only aspects necessary for understanding these principles are illustrated. The drawings are not to scale. In the drawings the same reference characters denote like features.

DETAILED DESCRIPTION

In the following detailed description, reference is made to the accompanying drawings. The drawings form a part of the description and for the purpose of illustration show examples of how the invention may be used and implemented. It is to be understood that the features of the various embodiments described herein may be combined with each other, unless specifically noted otherwise.

Figure 1:
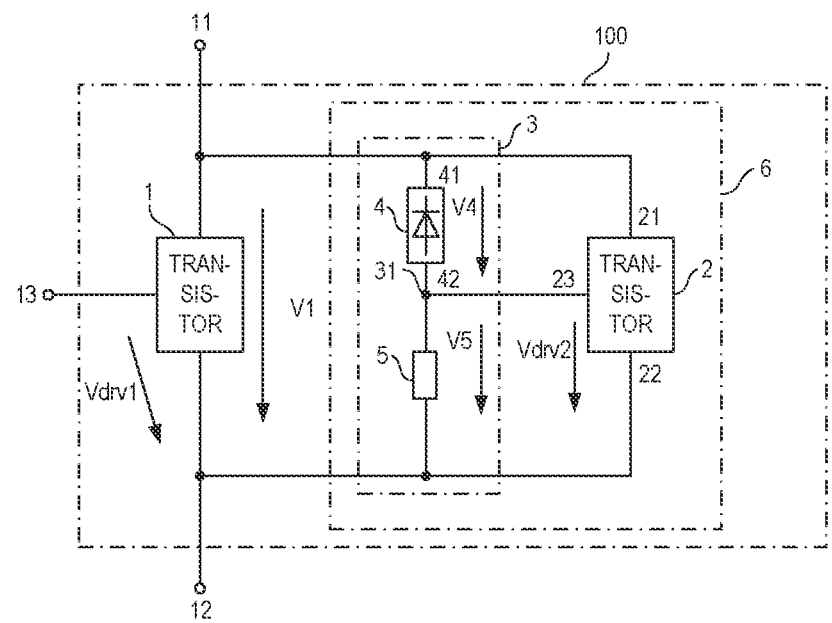
FIG. 1 illustrates one example of an electronic circuit that includes a first transistor device and a clamping circuit with a second transistor device.

FIG. 1 illustrates one example of an electronic circuit. The electronic circuit includes a first transistor device 1 and a clamping circuit 6. The first transistor device 1 includes a load path between a first load path node 11 and a second load path node 12. The clamping circuit 6 is connected to the load path of the first transistor device 1 and is configured to protect the first transistor device 1 against an overvoltage across the load path.

The clamping circuit 6 includes a second transistor device 2 and a drive circuit 3 configured to drive the second transistor device 2. The second transistor device 2 includes a load path between a first load path node 21 and a second load path node 22, wherein the load path of the second transistor device 2 is connected in parallel with the load path of the first transistor device 1. For this, in the example shown in FIG. 1, the first load path node 21 of the second transistor device 2 is connected to the first load path node 11 of the first transistor device 1, and the second load path node 22 of the second transistor device 2 is connected to the second load path node 12 of the first transistor device 1.

The drive circuit 3 includes a clamping element 4 and a resistor 5. The clamping element 4 and the resistor 5 are connected in series between the first and second load path nodes 11, 21, 12, 22 of the first and second transistor devices 1, 2. Furthermore, the drive circuit 3 is configured to drive the second transistor device 2 dependent on a voltage V5 across the resistor 5.

According to one example, the second transistor device 2 is a voltage-controlled transistor device such as, for example, a HEMT (high electron mobility transistor) or GIT (gate injection transistor). A voltage-controlled transistor is configured to switch on or off dependent on a drive voltage Vdrv2 received between the control node 23 and the second load path node 22. In the example shown in FIG. 1, the second transistor device 2 is directly controlled by the voltage V5 across the resistor 5. For this, the resistor 5 is connected between the control node 23 and the second load path node 22 of the second transistor device 2, so that the voltage V5 across the resistor equals the drive voltage Vdrv2 of the second transistor device 2. However, directly controlling the second transistor device 2 by the voltage V5 across the resistor 5 is only an example. Another example, in which the second transistor device 2 is indirectly controlled by the voltage V5 across the resistor 5 is explained herein further below.

Furthermore, the first transistor device 1 and the clamping circuit 6 are integrated in the same semiconductor die 100. The semiconductor die 100 is only schematically illustrated in the circuit diagram according to FIG. 1. Integrating the first transistor device 1 and the clamping circuit 6 in the same semiconductor die 100 is explained in detail herein further below.

The first transistor device 1 has a voltage blocking capability, which is the maximum voltage the first transistor device 1 can withstand between the first and second load path nodes 11, 12. When a voltage higher than the voltage blocking capability occurs between the first and second load path nodes 11, 12 a voltage breakdown of the first transistor device 1 may occur. Such voltage breakdown may damage the first transistor device 1. It is therefore desirable to prevent the load path voltage V1, which is the voltage between the first and second load path nodes 11, 12, from reaching a voltage level that may cause a voltage breakdown of the first transistor device 1.

The clamping circuit 6 is configured to prevent the load path voltage V1 from reaching a voltage level that may cause a voltage breakdown of the first transistor device 1. The functionality of the clamping circuit 6 is explained in the following.

In the clamping circuit 6, the clamping element 4 connected in series with the resistor 5 has a threshold voltage (which may also be referred to as clamping voltage). The clamping element 4 is configured to clamp a voltage V4 across the clamping element 4 such that the voltage V4 essentially does not exceed the threshold voltage. Whenever the voltage V4 across the clamping element 4 reaches the clamping voltage the clamping element 4 starts to conduct a current between a first node 41 and a second node 42 so as to prevent the voltage V4 across the clamping element 4 from increasing further. The current through the clamping element 4 at least partially flows through the resistor 5 and causes the voltage V5 across the resistor 5 to increase.

When the voltage V5 across the resistor 5 reaches the threshold voltage of the second transistor device 2, the second transistor device 2 switches on and provides a low-ohmic current path between the first and second load path nodes 11, 12 of the first transistor device 1. In this way, the second transistor device 2 takes over at least a portion of the current causing the increase of the load path voltage V1 of the first transistor device 1, so that, in combination with the drive circuit 3, the second transistor device 2 protects the first transistor device 1 from undergoing a voltage breakdown.

Referring to FIG. 1, the load path voltage V1 of the first transistor device 1 essentially equals the voltage V4 across the clamping element 4 plus the voltage V5 across the resistor 5, V1=V4+V5. A maximum of the load path voltage V1 is essentially given by the threshold voltage of the clamping element 4 plus the threshold voltage of the second transistor device 2. According to one example, the threshold voltage of the second transistor device 2 is at least one order of magnitude smaller than the voltage blocking capability of the first transistor device 1. In this case, the maximum load path voltage of the first transistor device 1 is essentially given by the threshold voltage (clamping voltage) of the clamping element 4.

According to one example, the voltage blocking capability of the first transistor device 1 is several hundred volts (V) such as, for example, 600 V or 800 V. The threshold voltage of the second transistor device 2 is several volts such as between 1.5V and 4V, for example. According to one example, the clamping element 4 is the selected to have a threshold voltage that is between 3V and 15V lower than the voltage blocking capability of the first transistor device 1.

According to one example, the voltage blocking capability of the first transistor device 1 is several hundred volts (V) such as, for example, 600 V or 800 V. The threshold voltage of the second transistor device 2 is several volts such as between 1.5V and 4V, for example. According to one example, the clamping element 4 is selected to have a threshold voltage that is between 3V and 15V lower than the voltage blocking capability of the first transistor device 1.

According to one example, the second transistor device 2 is smaller than the first transistor device 1. This includes that, in the on-state, an electrical resistance of the second transistor device 2 is higher than an electrically neutral resistance of the first transistor device 1. Referring to the above, the electronic circuit with the first and second transistor devices 1, 2 is integrated in one semiconductor die 100. Each of the first and second transistor devices 1, 2 occupies a certain area in the semiconductor die 100. According to one example, the second transistor device 2 being smaller than the first transistor device 1 includes that an area occupied by the second transistor device 2 is between 5% and 20% of an overall area occupied by the first and second transistor devices 1, 2. Equivalently, an area occupied by the first transistor device 1 is between 85% and 95% of an overall area of the first and second transistor devices 1, 2.

An electronic circuit of the type illustrated in FIG. 1 can be used as an electronic switch in various types of applications. One example of a typical application is illustrated in FIG. 2.

Figure 2:
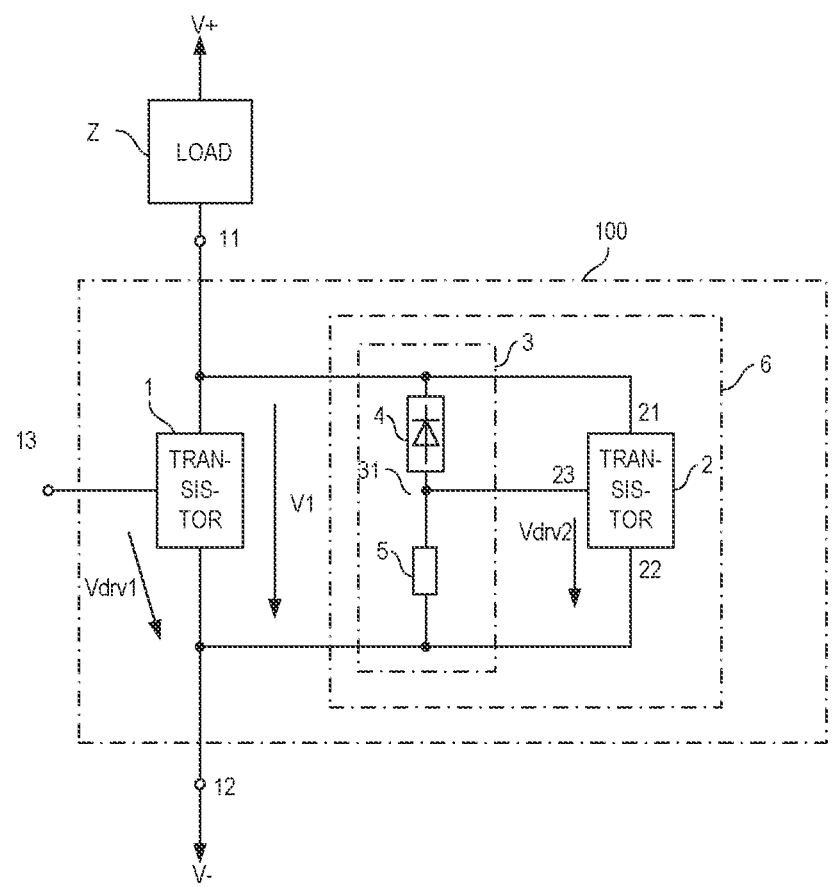
FIG. 2 illustrates one example of an application circuit that includes the electronic circuit shown in FIG. 1.

In the example shown in FIG. 2, the electronic circuit is connected in series with a load Z in such a way that the load path of the first transistor device 1 is connected in series with the load Z. The series circuit including the electronic circuit and the load Z is connected between supply nodes, a first supply node where a positive supply potential V+ is available, and a second supply node where a negative supply potential or ground potential V− is available. A voltage between the first and second supply nodes is referred to as a supply voltage in the following. According to an example, the supply voltage is lower than the voltage blocking capability of the first transistor device 1.

Just for the purpose of illustration, in the circuit according to FIG. 2, the electronic circuit with the first transistor device 1 is connected between the load Z and the second supply node. In this example, the first transistor device 1 acts as a low side switch. This, however, is only an example. According to another example (not illustrated), the electronic circuit with the first transistor device 1 is connected between the first supply node and the load Z. In this example, the first transistor device 1 acts as a high side switch.

According to one example, the first transistor device 1 is a voltage-controlled transistor device and switches on or off dependent on a voltage level of a drive voltage Vdrv1 received between the control node 13 and the second load node 12. A conventional control circuit can be used to generate the drive voltage Vdrv1 and control the first transistor device 1. Such control circuit is not illustrated in FIG. 2.

When the first transistor device 1 switches from an on-state, in which the first transistor device 1 can conduct a current through the load path, to an off-state, in which the first transistor device 1 blocks, the load path voltage V1 may exceed the supply voltage. Such excessive increase of the load path voltage V1 may be caused by parasitic inductances such as line inductances in the circuit, or by loads which are partly or largely inductive. In the way explained above, the clamping circuit 6 protects the first transistor device 1 against such overvoltages.

Referring to the above, the current through the clamping element 4 at least partially flows through the resistor 5. This includes that a portion of the current through the clamping element 4 may flow into the control node 23 of the second transistor device 2. To what extent the current through the clamping element 4 flows into the control node 23 of the second transistor device 2 is dependent on the specific implementation of the second transistor device 2 as follows.

According to one example, the first and second transistor devices 1, 2 are implemented in the same way. That is, the first and second transistor devices 1, 2 are transistor devices of the same type. Examples for implementing the first and second transistor devices 1, 2 are explained with reference to FIGS. 3 and 4, wherein each of FIGS. 3 and 4 shows circuit symbols of possible transistor types.

Figure 3:
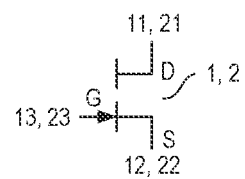
FIGS. 3-4 illustrate different examples for implementing the first and second transistor devices.

According to the example illustrated in FIG. 3, each of the first and second transistor devices 1, 2 is implemented as a HEMT such as a GaN HEMT. In this example, a gate node G of the HEMT forms the respective control nodes 13, 23, a drain node D of the HEMT forms the respective first load nodes 11, 21, and a source node S of the HEMT forms the respective second load nodes 12, 22. A HEMT is a voltage-controlled device that switches on or off dependent on a voltage level of a drive voltage received between the gate and source nodes. According to one example, the HEMT is implemented as a GIT (Gate Injection Transistor), which is a normally-off transistor. In this case, a certain current flow between the gate and source nodes G, S is required in order to maintain the on-state of the device.

Figure 4:
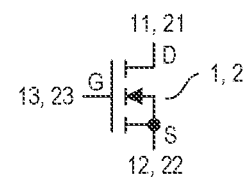

According to the example illustrated in FIG. 4, each of the first and second transistor devices 1, 2 is implemented as a MOSFET. In this example, a gate node G of the MOSFET forms the respective control nodes 13, 23, a drain node D of the MOSFET forms the respective first load nodes 11, 21, and a source node S of the MOSFET forms the respective second load node nodes 12, 22. A MOSFET is a voltage-controlled device that switches on or off dependent on a voltage level of a drive voltage received between the gate and source nodes. According to one example, the MOSFET is an enhancement MOSFET (which is a normally-off device) such as, for example, an n-type enhancement MOSFET. In a MOSFET, a current flow between the gate and source nodes G, S is required only at the beginning of the on-state in order to charge a gate-source capacitance.

Figure 5:
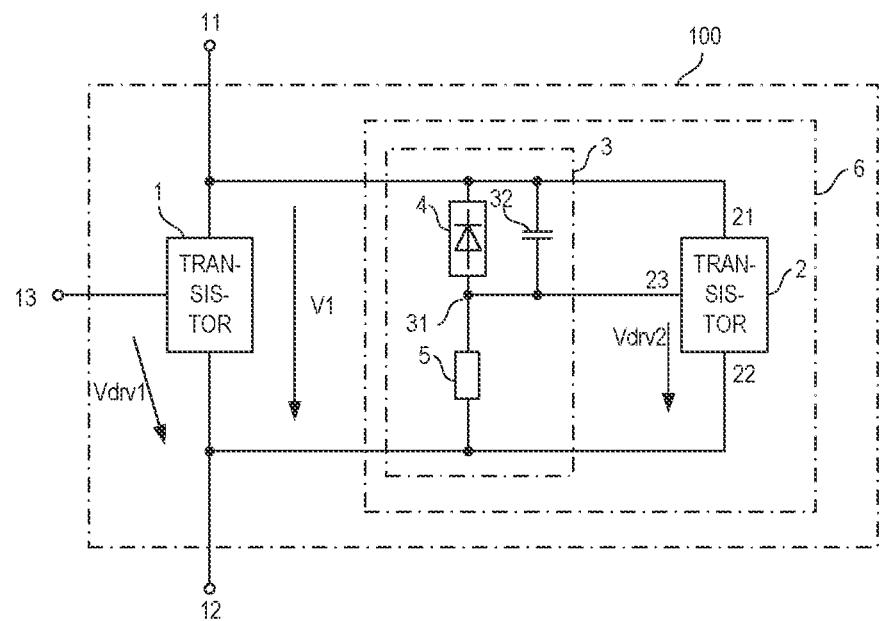
FIGS. 5-7 illustrate different modifications of the clamping circuit according to FIG. 1.
Figure 6:
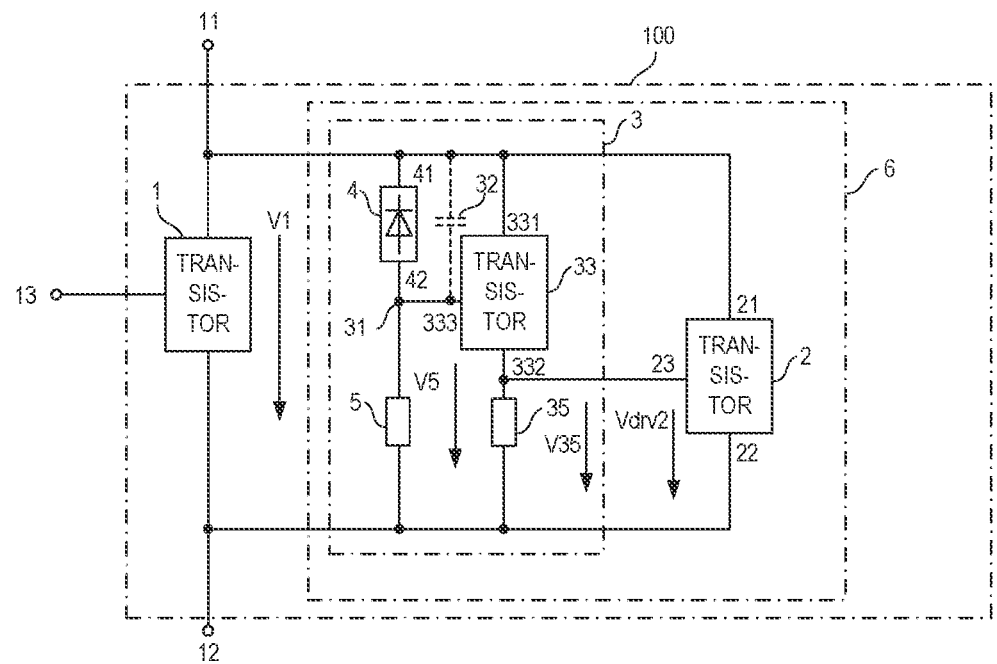
Figure 7:
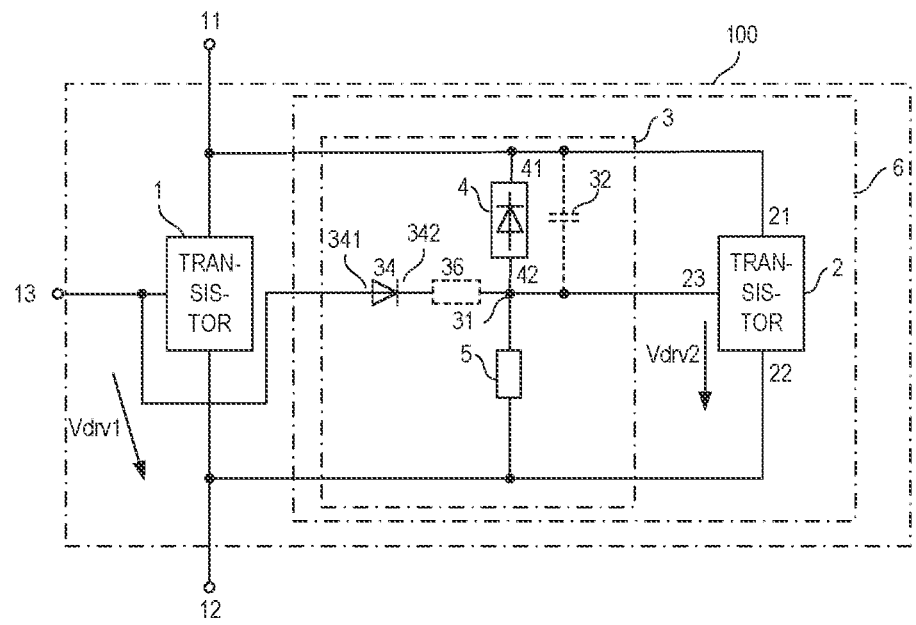

FIGS. 5-7 illustrate various modifications of the electronic circuit shown in FIG. 1. Each of these electronic circuits is based on the electronic circuit illustrated in FIG. 1 and includes a first transistor device 1 and a clamping circuit 6, wherein the clamping circuit 6 is connected to the load path of the first transistor device 1 and configured to protect the first transistor device 1 against overvoltages between the first and second load nodes 11, 12.

In the example illustrated in FIG. 5, the drive circuit 3 of the clamping circuit 6 further includes a capacitor 32 connected in parallel with the clamping element 4. In this clamping circuit, a rapid increase of the load path voltage V1 may cause a current pulse into the capacitor 32 and through the resistor 5 in such a way that the second transistor device 2 may switch on before the load path voltage V1 has reached the threshold voltage (clamping voltage) of the clamping element 4. This provides a further degree of protection.

FIG. 6 illustrates one example of the clamping circuit 6 in which the second transistor device is indirectly driven by the voltage V5 across the resistor 5. In this example, the drive circuit 3 includes a further transistor device 33 and a further resistor 35. The further transistor device 33 includes a load path between a first load path node 331 and a second load path node 332, and a control node 333. The load path of the further transistor device 33 is connected in series with the further resistor 35. The series circuit including the further transistor device 33 and the resistor 35 is connected between the first and second load path nodes 11, 12 of the first transistor device 1 and, therefore, in parallel with the load path of the first transistor device 1.

The further transistor device 33 is a voltage-controlled device that switches on or off dependent on a drive voltage received between the control node 333 and the second load node 332. According to one example, the further transistor device 33 is a transistor device of the same type as the first and second transistor devices 1, 2. In the drive circuit 3 according to FIG. 6, the further transistor device 33 is controlled by the voltage V5 across the resistor 5. For this, the control node 333 of the further transistor device 33 is connected to a circuit node 31 between the clamping element 4 and the resistor 5. Furthermore, the second transistor device 2 is controlled by a voltage V35 across the further resistor is 35. For this, the further resistor 35 is connected between the control node 23 and the second load path node 22 of the second transistor device 2.

In the clamping circuit 6 according to FIG. 6, the second transistor device 2 switches on when the voltage V35 across the further resistor 35 reaches the threshold voltage of the second transistor device 2. The voltage V35 across the further resistor 35 reaches the threshold voltage of the second transistor 2 when the load path voltage V1 of the first transistor device 1 is high enough for the clamping element 4 to conduct a current and increase the voltage V5 across the resistor 5 such that a voltage level of the voltage V5 essentially equals the sum of the threshold voltages of the further transistor device 33 and the second transistor device 2 when the second transistor device 2 begins to conduct.

In the clamping circuit 6 according to FIG. 6, a current into the control node 23 of the second transistor device 2 is provided by the further transistor device 33 (instead of the clamping element 4). In a second transistor device 2 implemented as a HEMT, for example, such current may be required to switch on the second transistor device 2 and maintain the second transistor device 2 in the on-state. In a second transistor device 2 implemented as a MOSFET, for example, such current may be required to charge an internal gate-source capacitance of the MOSFET, so that the MOSFET switches on.

In the on-state, the further transistor devices 33 has a lower resistance than the clamping element 4 in the clamping state. The "clamping state" is an operating state of the clamping element 4 in which the voltage V4 has reached the threshold voltage of the clamping element 4, so that the clamping element 4 conducts a current. Thus, in the clamping circuit 6 according to FIG. 6, the second transistor device 2 switches on faster than in the clamping circuits 6 according to FIGS. 1 and 5, although in the clamping circuit 6 according to FIG. 6, a higher voltage V5 across the resistor 5 is required in order to switch on the second transistor device 2.

Referring to the above, the further transistor device 33 may be a transistor of the same type as the second transistor device 2. According to one example, the further transistor device 33 is smaller than the second transistor device 2. According to one example, a size of the further transistor device 33 is between 5% and 50%, or as low as between 5% and 20% of the size of the second transistor device 2.

In the examples of the clamping circuit 6 explained before, the second transistor device 2 only switches on dependent on a voltage level of the load path voltage V1 of the first transistor device 1. FIG. 7 illustrates one example of the clamping circuit 6 in which the second transistor device 2 not only switches on when the load path voltage V1 of the first transistor device 1 reaches a voltage level higher than the clamping voltage of the clamping element 4, but also switches on when the drive voltage Vdrv1 received between the control node 13 and the second load path node 12 of the first transistor device 1 reaches a voltage level that switches on the first transistor device 1.

In the example illustrated in FIG. 6, the control node 23 of the second transistor device 2 is coupled to the control node 13 of the first transistor device 1 in such a way that an increase of the drive voltage Vdrv1 received by the first transistor device 1 causes an increase of the drive voltage Vdrv2 received by the second transistor device 2, so that the second transistor device 2 switches on when the first transistor device 1 switches on. According to one example, for coupling of the control node 23 of the second transistor device 2 to the control node 13 of the first transistor device 1, a coupling element is connected between the control nodes 13, 23 of the two transistor devices 1, 2. According to one example, the coupling element 34 is a rectifier element such as, for example, a diode. Optionally, a resistor 36 is connected in series with the rectifier element 34 in order to reduce the current flowing through the rectifier element 34.

A polarity of the rectifier element 34 is such that the rectifier element 34 is capable of conducting a current from the control node 13 of the first transistor device 1 to the control node 23 of the second transistor device 2, but not in the opposite direction. In this way, both the first transistor device 1 and the second transistor device 2 switch on when the drive voltage Vdrv1 reaches a voltage level that is suitable to switch on the first and second transistor devices 1, 2. However, when the load path voltage V1 of the first transistor device 1 reaches a voltage level that causes the clamping element 4 to conduct a current and switch on the second transistor device 2, the rectifier element 34 blocks and prevents the first transistor device 1 from being switched on.

When the drive voltage Vdrv1 of the first transistor device 1 changes from the on-level to the off-level, resistor 5 according to FIG. 5 or resistor 35 according to FIG. 6 causes the second transistor device 2 to switch off. In the example according to FIG. 6, resistor 5 causes the further transistor device 33 to switch off when the drive signal Vdrv1 of the first transistor device 1 changes from the on-level to the off-level.

In the drive circuit 3 according to FIG. 7, the remainder of the drive circuit 3 can be implemented in accordance with any one of the examples explained herein before. That is, the drive circuit 33 may include a capacitor 32 (illustrated in dashed lines) connected in parallel with the clamping element 4. Furthermore, the drive circuit 33 may be implemented without a further transistor device of the type illustrated in FIG. 6 (as illustrated in FIG. 7) or may be implemented with a further transistor device of the type illustrated in FIG. 6 (not illustrated in FIG. 7).

Figure 8A:
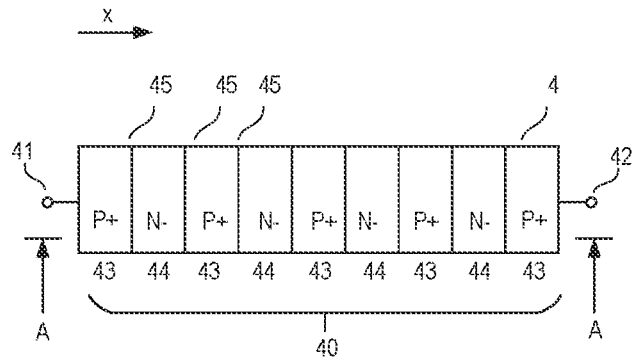
FIGS. 8A-8B illustrate one example of a clamping element included in the clamping circuit.
Figure 8B:
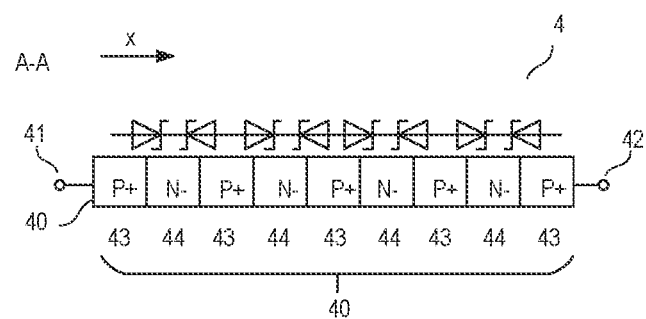

FIGS. 8A-8B illustrate one example of the clamping element 4. In this example, the clamping element 4 includes a polycrystalline semiconductor layer 40, such as, for example, a polycrystalline silicon layer (polysilicon layer). FIG. 8A shows a top view and FIG. 8B shows a vertical cross-sectional view of the semiconductor layer 45. The polycrystalline semiconductor layer 40 may be arranged on top of a carrier. Such carrier, however, is not illustrated in FIGS. 8A-8B.

Referring to FIGS. 8A and 8B, the semiconductor layer 40 includes a plurality of doped regions 43, 44, wherein a doping type and an arrangement of these doped regions in the polycrystalline semiconductor layer 40 is such that a plurality of PN junctions are formed in the semiconductor layer 14. According to one example, the doped regions include first regions 43 of a first doping type (conductivity type) and second regions 44 of a second doping type (conductivity type), wherein the first and second regions 43, 44 are arranged alternatingly in a first direction x of the semiconductor layer 40. Between each first region 43 and an adjoining second regional 44 a PN junction is formed.

According to one example (as illustrated in FIGS. 8A and 8B) the first doped regions 43 are P-doped regions and the second doped regions 44 are N-doped regions. According to one example, doping concentrations of the first and second regions 43, 44 are adapted to one another such that each first region 43 and the adjoining second region 44 form a Zener diode or Avalanche diode. According to one example, this is achieved by implementing the first regions 43 with a higher doping concentration than the second regions 44. According to one example, the doping concentration of the first regions 43 is higher than $1E16$ cm$^{-3}$ and is selected from between $1E16$ cm$^{-3}$ and $1E21$ cm$^{-3}$, for example. The doping concentration of the second regions 44 is lower than $1E17$ cm$^{-3}$, lower than $1E15$ cm$^{-3}$, or lower than $1E14$ cm$^{-3}$, for example.

For a better understanding, a diode series circuit that includes a plurality of Zener diodes or Avalanche diodes that are formed by the first and second regions 43, 44 and the respective PN junctions is illustrated in FIG. 8B next to the polycrystalline semiconductor layer 40. As can be seen from the diode series circuit, the clamping element 4 according to FIGS. 8A-8B is a bidirectionally blocking clamping element. That is, the clamping element 4 blocks voltages with a voltage level lower than a first clamping voltage when a positive voltage is applied between the first node 41 and the second node 42, and blocks voltages with a voltage level lower than a second clamping voltage when a negative voltage is applied between the first node 41 and the second node 42. The diode series circuit includes a first group of diodes only and a second group of diodes. Diodes of the first group are those diodes that have their respective cathodes facing the first node 41 and the respective anodes facing the second node 42. Diodes of the second group are those diodes that have their respective cathodes facing the second node 42 and the respective anodes facing the first node 41.

The first clamping voltage is essentially defined by the diodes of the first group and is essentially given by the sum of the breakdown voltages of the Zener diodes or Avalanche diodes in the first group. The second clamping voltage is essentially defined by the diodes of the second group and is essentially given by the sum of the breakdown voltages of the Zener diodes or Avalanche diodes in the second group. Thus, each of the first and second clamping voltages can be adjusted by suitably selecting the number of diodes in the series circuit, that is, by suitably selecting the number of first and second regions 43, 44 arranged in the polycrystalline semiconductor layer 40.

Figure 9:
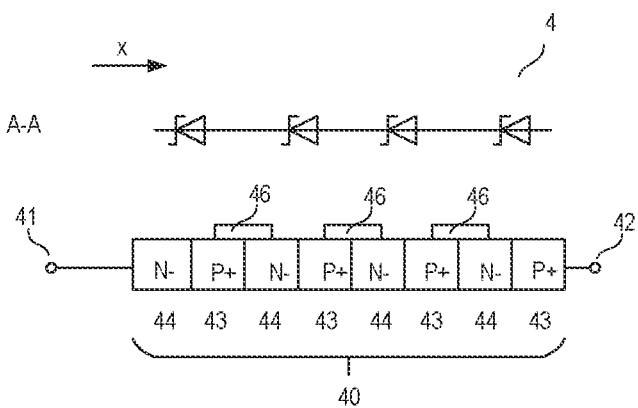
FIG. 9 illustrates a modification of the clamping element illustrated in FIGS. 8A-8B.

FIG. 9 illustrates a modification of the clamping element 4 shown in FIGS. 8A-8B, wherein FIG. 9 shows a vertical cross-sectional view of the polycrystalline semiconductor layer 40. The clamping element 4 according to FIG. 9 is a unidirectionally blocking clamping element. This is achieved by bypassing Zener diodes or Avalanche diodes of one of the first and second groups. Just for the purpose of illustration, in the example shown in FIG. 9, the diodes of the second group are bypassed, so that the clamping element 4 blocks when a positive voltage lower than the first clamping voltage is applied between the first node 41 and the second node 42. The clamping element 4 conducts when a positive voltage is applied between the second node 42 and the first node 41.

Bypassing a Zener or Avalanche diode may include electrically connecting the first region 43 and the second region 44 forming the respective Zener or Avalanche diode. "Electrically connecting" may include forming a conductor 46 on top of the respective first and second regions 43, 44 such that the conductor 46 ohmically contacts the first and second regions 43, 44. The conductor 46 includes a metal or a silicide, for example.

In the example illustrated in FIG. 9, each of the Zener or Avalanche diodes of the second group is bypassed. This, however, is only an example. According to another example (not illustrated) only some of the diodes of the second group are bypassed. In this way, a bidirectionally blocking clamping element 4 is obtained, wherein the second clamping voltage—due to the bypassed diodes—is lower than the first clamping voltage.

In each of the examples of the drive circuit 3 explained herein before, a bidirectionally blocking or a unidirectionally blocking clamping element 4 can be used.

Figure 10:
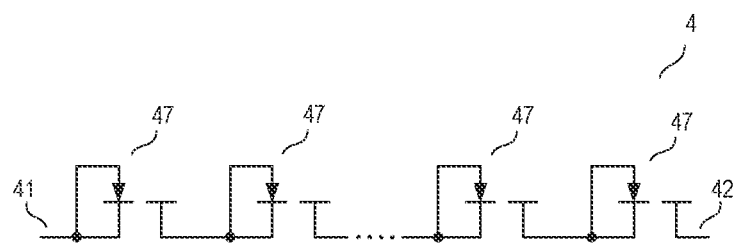
FIG. 10 illustrates yet another example of a clamping element.

FIG. 10 illustrates a clamping element 4 according to another example. In this example, the clamping element 4 includes a plurality of transistors 47 that have their load paths connected in series between the first node 41 and the second node 42. The transistors 47 are so-called diode-connected or Vth connected transistors. That is, each of the transistors 47 has the respective control node connected to the first load node. Just for the purpose of illustration, the transistors 47 shown in FIG. 10 are HEMTs. In this example, each of the transistors 47 has its gate node connected to its drain node. In this case, in the conducting state, a voltage across each HEMT essentially equals the respective threshold voltage (Vth).

A diode-connected transistor conducts when the load path voltage reaches the threshold voltage of the transistor. Thus, in the clamping element 4 illustrated in FIG. 10, the clamping voltage is essentially given by the sum of the threshold voltages of the transistors 47 connected in series. The clamping voltage can therefore be adjusted by suitably selecting the number of transistors 47 connected in series.

In the clamping circuit 6 according to FIG. 7, the rectifier element 34 of the drive circuit 3 is a unidirectionally blocking rectifier element that conducts when an electrical potential at a first node 341 is higher than an electrical potential at a second node 342. The rectifier element 34 blocks when the electrical potential at the second node 342 is higher than the electrical potential at the first node 341. A rectifier element 34 of this type may be implemented similar to the clamping element 4 illustrated in FIG. 9. This is explained with reference to FIG. 11 in the following.

Figure 11:
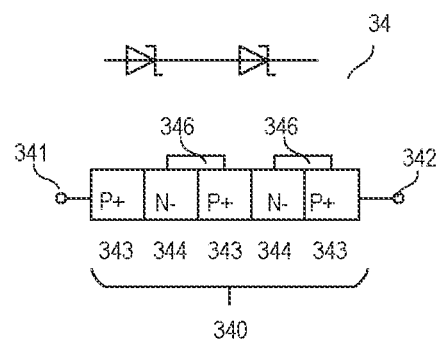
FIG. 11 illustrates one example for implementing a rectifier element in the clamping circuit according to FIG. 7.

FIG. 11 illustrates a vertical cross-sectional view of one example of the rectifier element 34. In this example, the rectifier element 34 includes a polycrystalline semiconductor layer 340 such as, for example, a polysilicon layer. The polycrystalline semiconductor layer 340 includes several first regions 343 of the first doping type and several second regions 344 of the second doping type, wherein the first and second regions 343, 344 are alternatingly arranged in the polycrystalline semiconductor layer 340. A PN junction is formed between each first region 343 and the adjoining second region 344, so that each first region 343 and the adjoining second region 344 form a Zener diode or Avalanche diode. These Zener or Avalanche diodes include one or more diodes of a first group and one or more diodes of a second group, wherein the diodes of one of these first and second groups are bypassed in order to obtain a unidirectionally blocking rectifier element 34.

Figure 12:
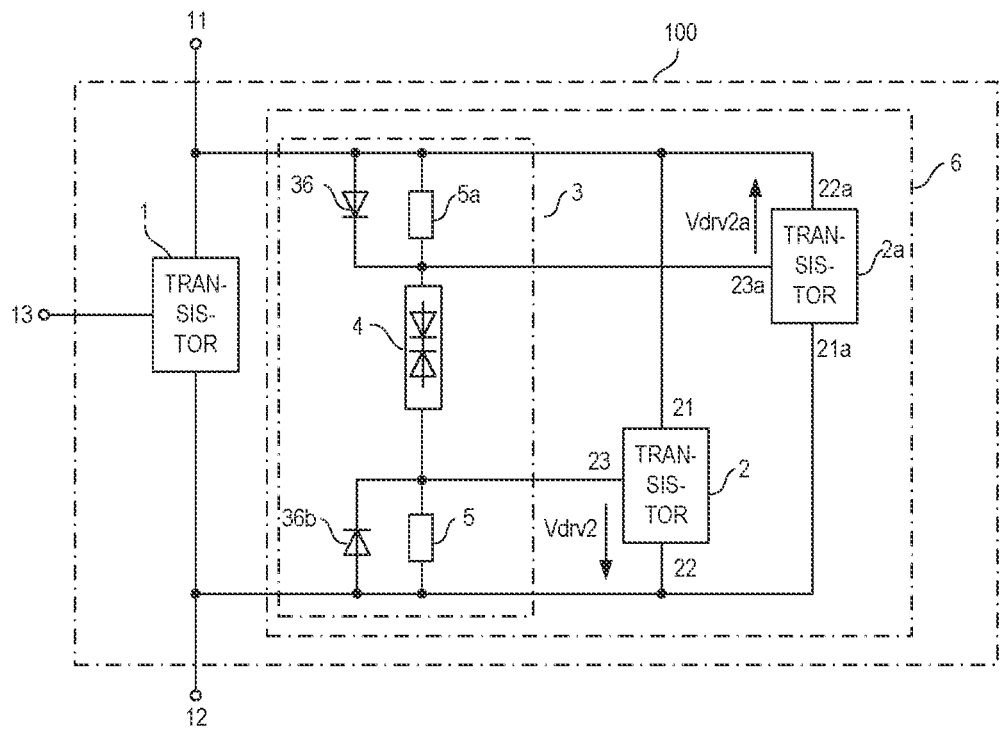
FIG. 12 illustrates an electronic circuit with a bidirectional clamping circuit according to one example.

FIG. 12 illustrates a further example of the clamping circuit 6. The clamping circuit 6 shown in FIG. 12 is based on the clamping circuit illustrated in FIG. 1 and, in addition to the second transistor devices 2, includes a third transistor device 2a with a load path between a first load path node 21a and a second load path node 22a. The load path of the second transistor device 2a is connected in parallel with the load paths of the first and second transistor devices 1, 2. The load path of the third transistor device 2a is connected in parallel with the load path of the first transistor device 1 such that the second load path node 22a of the third transistor device 2a is connected to the first load path node 11 of the first transistor device 1 and the first load path node 21a of the second transistor device 2a is connected to the second load path node 12 of the first transistor device 1. According to one example, the third transistor device 2a is a voltage-controlled transistor device that switches on or off dependent on a drive voltage Vdrv2a received between a control node 23a and the second load path node 22a. According to one example, the third transistor device 2a is a transistor device of the same type as the first and second transistor devices 1, 2.

For controlling the second transistor device 2a, the drive circuit 3 includes a further resistor 5a connected in series with the clamping element 4 and the resistor 5. In the example illustrated in FIG. 12, the third transistor device is directly controlled by a voltage across the further resistor 5a. For this, the further resistor 5a is connected between the control node 23a and the second load path node 22a of the third transistor 2a. This, however, is only an example. According to another example (not illustrated), the third transistor 2a is indirectly driven by the voltage across the resistor 5a using a further transistor in the same way as illustrated in FIG. 6.

Referring to FIG. 12, the clamping element 4 is connected between the resistor 5 and the further resistor 5A. The clamping element 4 is a bidirectionally blocking clamping element, for example.

The clamping circuit 6 illustrated in FIG. 12 is capable of protecting the first transistor device 1 against overvoltages with a first polarity and overvoltages with a second polarity. A voltage with a first polarity is a positive voltage between the first load path node 11 and the second load path node 12, and a voltage with a second polarity is a negative voltage between the first load path node 11 and the second load path node 12. In the clamping circuit according to FIG. 12, the second transistor device 2, driven by the voltage across the resistor 5, switches on when an overvoltage with the first polarity occurs. Equivalently, the third transistor device 2a, driven by the voltage across the further resistor 5a, switches on when an overvoltage with the second polarity occurs. For this, the second transistor device 2 may be implemented in such a way that it switches on or off dependent on drive voltage Vdrv2 that is referenced to the second load path node 12, and the second transistor device 2a may be implemented in such a way that it switches on or off dependent on drive voltage Vdrv2a that is a referenced to the first load path node 11.

Furthermore, the clamping circuit 6 according to FIG. 12 includes a first rectifier element 36 that bypasses the further resistor 5a when the load path voltage V1 of the first transistor device 1 has the first polarity, and a second rectifier element 36a that bypasses the resistor 5 when the load path voltage V1 has the second polarity.

Referring to the above, the first transistor device 1 and the clamping circuit 6 are integrated in the same semiconductor die 100. Examples for integrating the first transistor device 1 and the clamping circuit 6 in the same die 100 are explained in the following.

Figure 13:
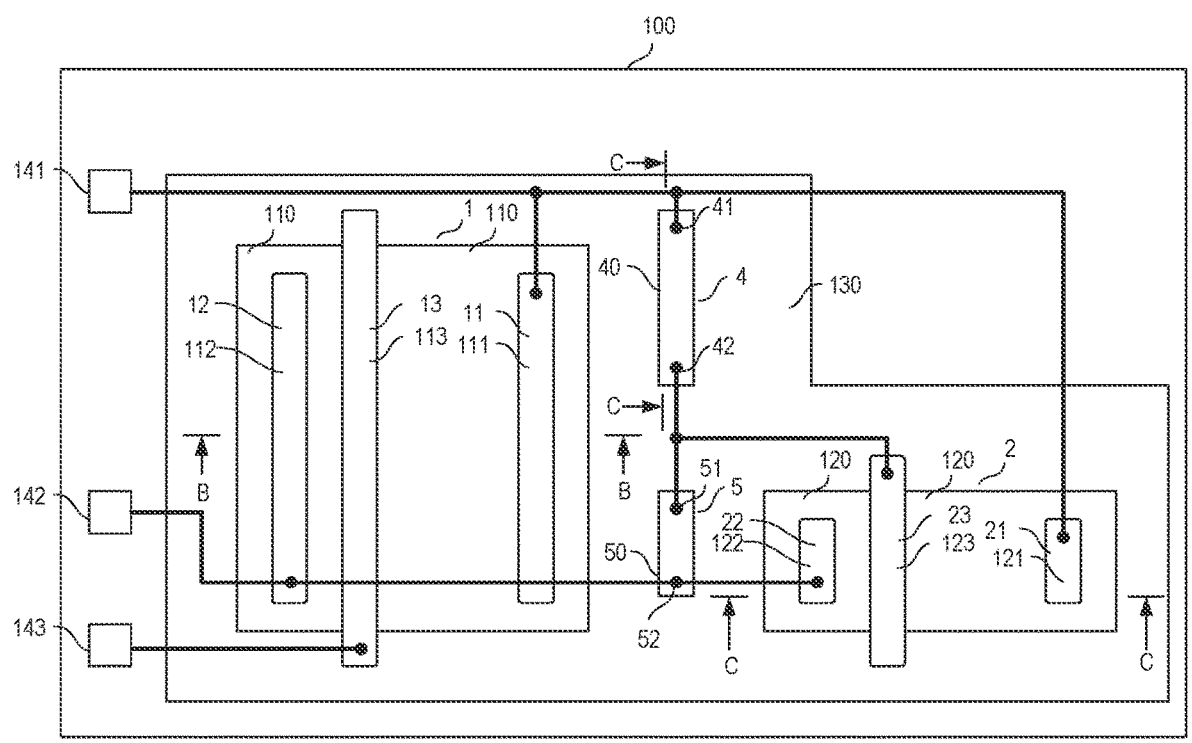
FIG. 13 shows a top view of a semiconductor die in which an electronic circuit with first and second transistor devices implemented as HEMTs is integrated.

FIG. 13 shows a top view of a semiconductor die 100 according to one example. In this example, each of the first and second transistor devices 1, 2 is implemented as a HEMT. The semiconductor die includes a first active region 110 and a second active region 120 that are spaced apart from each other and separated from each other by a passive region or insulation region 130.

The first transistor device 1 includes a 2DEG (two-dimensional electron gas) that is arranged in the first active region 110. Furthermore, the first transistor device 1 includes a drain electrode 111, a source electrode 112, and gate electrode 113 that are arranged in the first active region 110 and are spaced apart from each other. More specifically, the gate electrode 113 is arranged between the drain electrode 111 and the source electrode 112 and is spaced apart from each of the drain electrode 111 and the source electrode 112. The gate electrode 113 may be arranged closer to the source electrode 112 than to the drain electrode 111. This, however, is only an example. In the first transistor device 1, the drain electrode 111 forms the drain node 11, the source electrode 112 forms the source node 12, and the gate electrode 113 forms the gate node 13.

The second transistor device 2 includes a 2DEG that is arranged in the second active region 120. Furthermore, the second transistor device includes a drain electrode 121, a source electrode 122, and a gate electrode 123 that are arranged in the second active region 120 and are spaced apart from each other. More specifically, the gate electrode 123 is arranged between the drain electrode 121 and the source electrode 122 and is spaced apart from each of the drain electrode 121 and the source electrode 122. The gate electrode 123 may be arranged closer to the source electrode 122 than to the drain electrode 121. This, however, is only an example. In the second transistor device 2, the drain electrode 121 forms the drain node 21, the source electrode 122 forms the source node 22, and the gate electrode 123 forms the gate node 23.

Referring to the above, the first transistor device 1 is larger than the second transistor device 2. According to one example, an area size of the first active region 110 is between 85% and 95% of an overall area of the first and second active regions 110, 120.

Referring to FIG. 13, the clamping element 4 and the resistor 5 are arranged in the passive region 130 of the semiconductor die 100. The clamping element 4 and the resistor 5 are only schematically illustrated in FIG. 13. In the example shown in FIG. 13, the clamping element 4 is implemented based on a polycrystalline semiconductor layer 40, wherein only the semiconductor layer 40 is illustrated in FIG. 13. The clamping element 4 may be implemented in accordance with any one of the examples explained with reference to FIGS. 8A-8B and 9.

However, the clamping element 4 is not restricted to being implemented in accordance with the examples illustrated in FIGS. 8A-8B and 9. The clamping element 4 can also be implemented in accordance with the example illustrated in FIG. 10. In the event that the transistors 4 illustrated in FIG. 10 are HEMTs, each of these HEMTs can be implemented based on an active semiconductor region of the type explained with reference to the first and second transistors 1, 2 herein below.

The resistor 5 includes a doped polycrystalline semiconductor layer 50 such as a polysilicon layer, for example. The semiconductor layer 50 can be implemented as a P-doped or as an N-doped semiconductor layer. In this example, a resistance of the resistor 5, inter alia, is dependent on a doping concentration of the semiconductor layer 15, a distance between first and second contacts 51, 52, and a vertical cross-sectional area of the polycrystalline semiconductor layer 15 in a section plane that is perpendicular to a current flow direction. The "current flow direction" is the direction, for example, in which the first and second contacts 51, 52 are spaced apart from each other. Basically, at a given distance between the contacts 51, 52 and a given cross-sectional area, the higher the doping concentration, the lower the resistance. Furthermore, at a given doping concentration and a given distance between the contacts 51, 52, the larger the cross-sectional area, the lower the resistance. Furthermore, at a given doping concentration and a given cross-sectional area, the shorter the distance between the contacts 51, 52, the lower the resistance.

Referring to FIG. 13, the semiconductor die 100 further includes a drain pad 141, a source pad 142, and a gate pad 143. The drain pad 141 is connected to the drain electrodes 111, 121 of the first and second transistor devices 1, 2, the source pad 142 is connected to the source electrodes 112, 122 of the first and second transistor devices 1, 2, and the gate pad 143 is connected to the gate electrode 113 of the first transistor device 1.

Connections between the pads 141, 142, 143 and individual parts of the first and second transistor devices 1, 2 and connections between the clamping element 4 and the resistor 5 and individual parts of the first and second transistor devices 1, 2 are illustrated by bold lines in FIG. 13. These connections may be implemented in conventional way. According to one example, these connections include conductors formed on top of an insulation layer, wherein the insulation layer covers the active and passive regions 110, 120, 130, and wherein the conductors are connected to the respective portions of the semiconductor die 100 through electrically conducting vias extending through the insulation layer from a conductor down to a respective portion of the semiconductor die 100.

Figure 14:
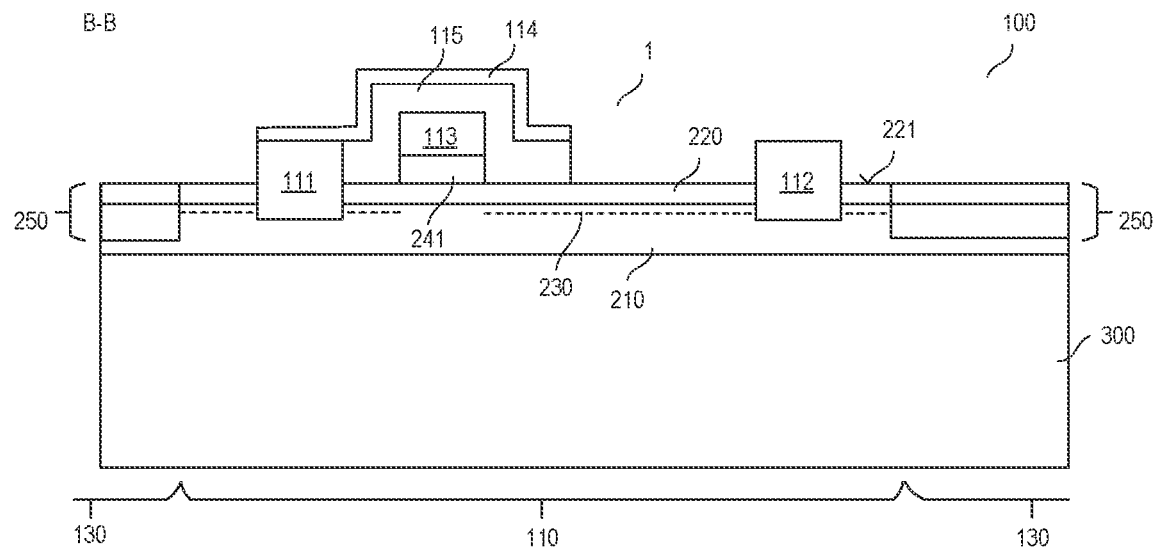
FIG. 14 shows a vertical cross-sectional view of the semiconductor die according to FIG. 13 in a first active region in which the first transistor device is integrated.
Figure 15:
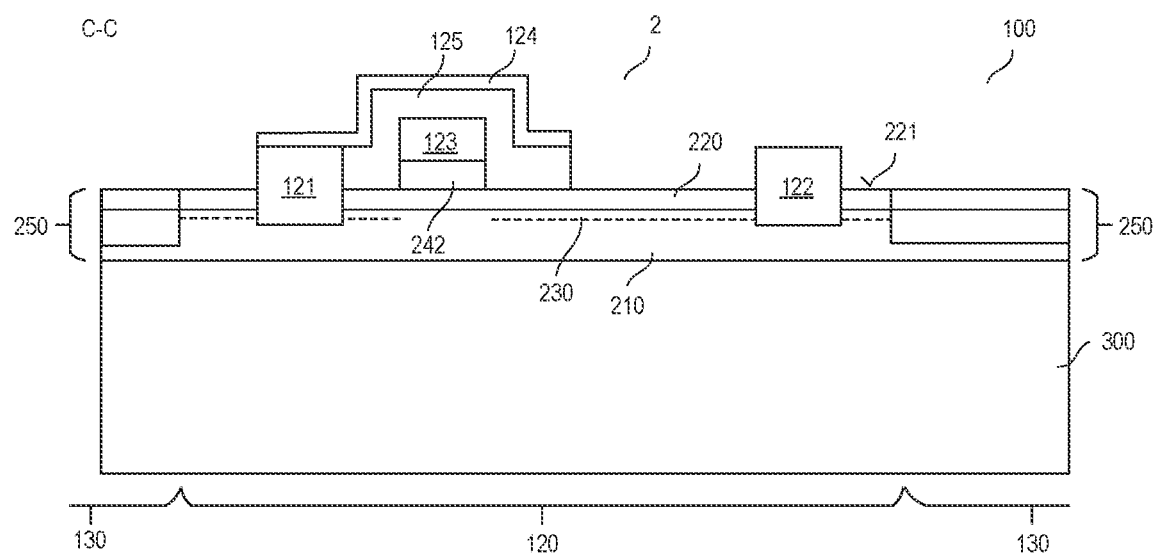
FIG. 15 shows a vertical cross-sectional view of the semiconductor die according to FIG. 13 in a second active region in which the second transistor device is integrated.

More detailed examples for implementing the semiconductor die 10 and the first and second transistor devices 1, 2 are illustrated in FIGS. 14 and 15. FIG. 14 illustrates a vertical cross-sectional view of the semiconductor die 100 in a first section plane B-B illustrated in FIG. 13. The first section plane B-B cuts through the first active region 110 and adjoining sections of the passive region 130. FIG. 15 illustrates a vertical cross-sectional view of the semiconductor die 100 in a second section plane C-C illustrated in FIG. 13. The second section plane C-C cuts through the second active region 120 and adjoining sections of the passive region 130.

Referring to referring to the above, each of the first and second active regions 110, 120 includes a 2DEG. In the example illustrated in FIGS. 14 and 15, the 2DEG 230 is formed along a heterojunction between a channel layer 210 and a barrier layer 220. According to one example, each of the channel layer 210 and the barrier layer 220 is a III-V semiconductor layer. According to one example, the channel layer 210 is a GaN layer and the barrier layer 220 is an AlGaN layer.

According to one example, the channel layer 210 and the barrier layer 220 extend across the entire semiconductor die 100. The passive region 130, however, is devoid of the 2DEG. For this, damaging particles have been implanted through the barrier layer 220 into the channel layer 210 to form a damaged region 250. The damaging particles damage the heterojunction between the channel layer 210 and the barrier layer 220, so that the damaged region 250 does not include a 2DEG.

The damaged region 250 may be formed using a conventional implantation process in which the damaging particles are implanted via a surface 221 of the barrier layer 220 through the barrier layer 220 into the channel layer 210. An implantation mask (not illustrated in FIGS. 14 and 15) may cover the active regions 110, 120 during the implantation process. Examples of the implanted damaging particles include, but are not restricted to, argon (Ar) ions, nitrogen (N) ions, or boron (B) ions.

The HEMTs according to FIGS. 14 and 15, which form the first and second transistor devices 1, 2, are implemented as normally-off HEMTs. For this, each of the first and second transistor devices 1, 2 includes a doped III-V semiconductor gate layer 241, 242 between the barrier layer 220 and the respective gate electrode 113, 123. This III-V semiconductor gate layer 241, 242 is referred to as gate semiconductor layer 241, 242 in the following. According to one example, the gate semiconductor layer 241, 242 is a P-doped GaN (pGaN) layer.

Optionally each of the first and second transistor devices 1, 2 includes a source field plate 114, 124. The source field plate 115, 125 is electrically connected to the respective source electrode 111, 121 and is electrically insulated from the gate electrode 113, 121 and the III-V semiconductor gate layer 241, 242 by an insulation layer 115, 125. Furthermore, the source field plates 114, 124, as seen from the source electrodes 111, 121, extend beyond the gate electrodes 113, 123 towards the drain electrodes 112, 122.

According to one example, the source electrodes 111, 121 and drain electrodes 112, 122 extend through the barrier layer 220 and into the channel layer 210 to adjoin the 2DEG. This, however, is only an example. According to another example (not illustrated) the source electrodes 111, 121 and drain electrodes 112, 122 extend through the barrier layer 200 to the channel layer 210 but not into the channel layer 210. According to yet another example (not illustrated) the source electrodes 111, 121 and drain electrodes 112, 122 are connected to the barrier layer 220 and spaced apart from the channel layer 210.

In the first and second transistor devices 1, 2 illustrated in FIGS. 14 and 15, the gate electrodes 113, 123 in combination with the gate semiconductor layers 241, 242 are configured to control the 2DEG between the source electrodes 111, 121 and the drain electrodes 112, 122. Each of the transistor devices 1, 2 is a normally-off device, so that the 2DEG 230 is interrupted (and the respective transistor device is in a blocking state) when the respective gate-source voltage is zero. Each of the transistor devices 1, 2 is in a conducting state when the respective gate-source voltage is higher than a threshold voltage. In the conducting state, there is a contiguous 2DEG between the drain electrode 112, 122 and the source electrode 111, 121 of the respective transistor device.

Figure 16:
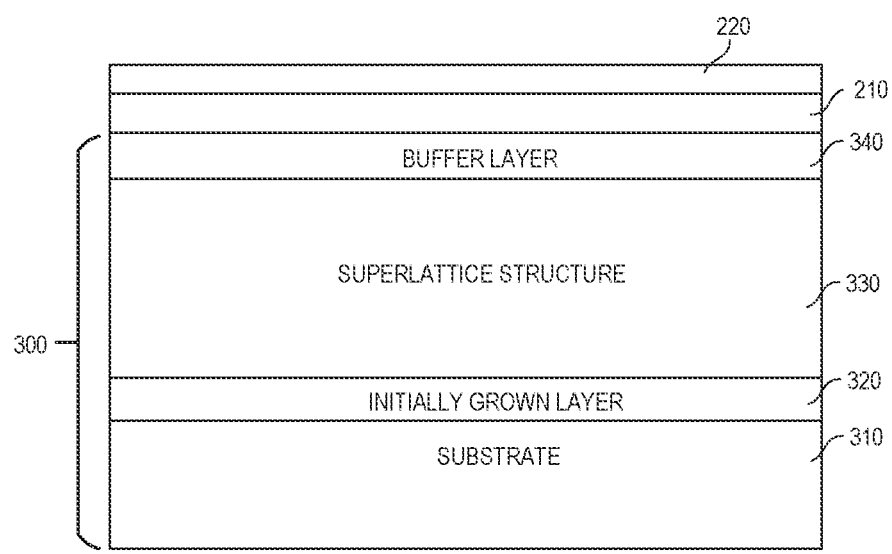
FIG. 16 illustrates one example of a carrier included in the semiconductor die according to FIG. 13.

Referring to FIGS. 14 and 15, the channel layer 210 is formed on top of a carrier 300, and the barrier layer 220 is formed on top of the channel layer 210. Carrier 300 may be implemented in a conventional way. FIG. 16 illustrates one example of the carrier 300.

Referring to FIG. 16, the carrier 300 may include a substrate 310 such as, for example, a monocrystalline silicon substrate, and an initially grown III-V semiconductor layer 320 grown on top of the substrate 310. The initially grown III-V semiconductor layer 320 is an AlN layer, for example.

The carrier 300 may further include a superlattice structure 330 formed on top of the initially grown layer 320, and a buffer layer 340 formed on top of the superlattice structure 330. The superlattice structure 330 may include a plurality of first and second III-V semiconductor layers that are alternatingly arranged one above the other in the superlattice structure 330. The first III-V semiconductor layers are AlN layers, for example, and the second III-V semiconductor layers are GaN layers, for example. The buffer layer 340 is a carbon-doped (C-doped) GaN layer, for example. Forming each of the initially grown layer 320, the superlattice structure 330 with the first and second III-V semiconductor layers, and the buffer layer 340 may include a respective epitaxial growth process.

Referring to FIG. 16, the channel layer 210 is formed on top of the buffer layer 340, and the barrier layer 220 is formed on top of the channel layer 210. Forming each of the channel layer 210 and the barrier layer 220 may include a respective epitaxial growth process.

The epitaxial growth processes for forming the initially grown layer 320, the superlattice structure 330, the buffer layer 340, the channel layer 210, and the barrier layer 220 may include one continuous epitaxial growth process in which precursor gases and/or deposition parameters may change during the process in order to achieve the different layers explained before.

Figure 17A:
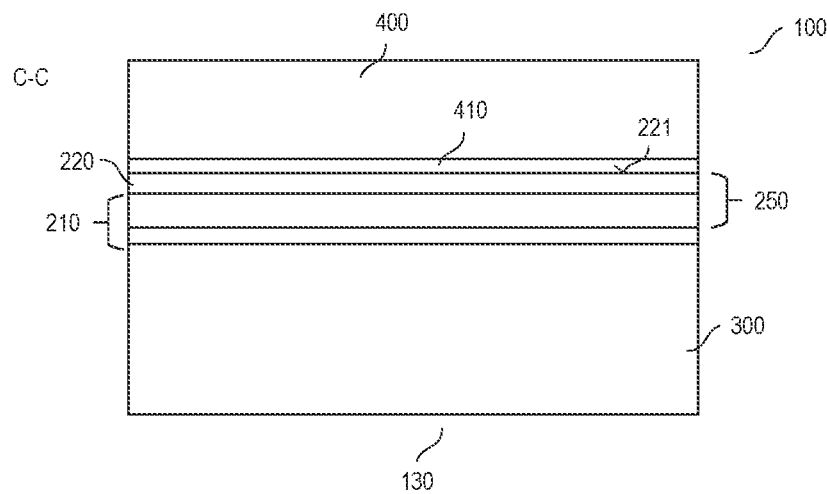
FIGS. 17A-17C illustrate one example of a method for forming the clamping element.
Figure 17B:
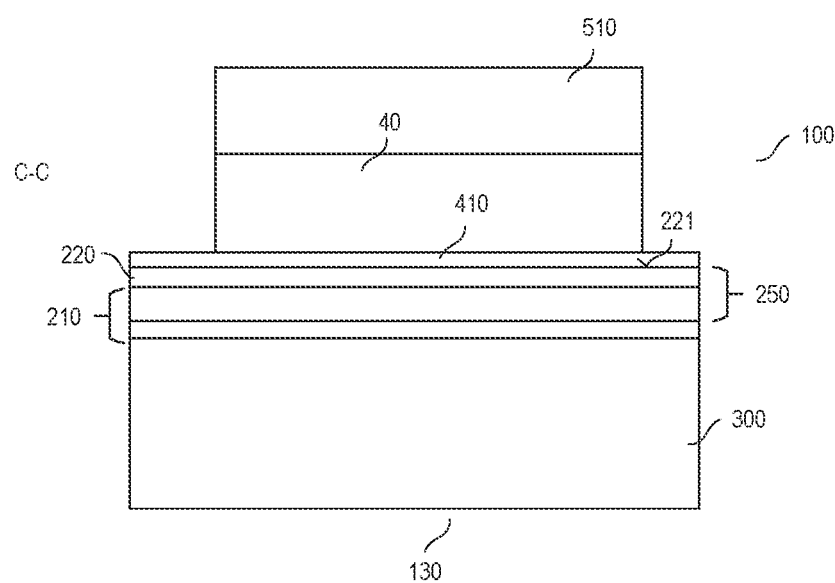
Figure 17C:
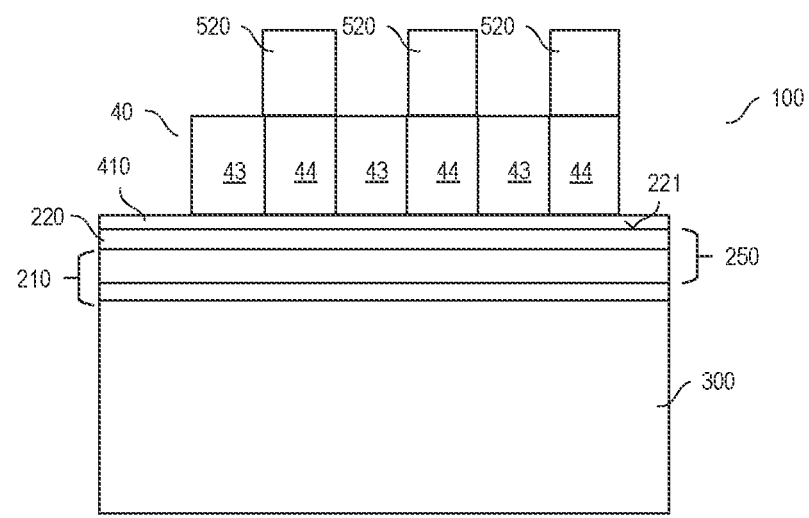

FIGS. 17A-17C illustrate one example of a method for forming a clamping element 4 that is based on a polycrystalline semiconductor layer 40. FIGS. 17A-17C illustrate a vertical cross-sectional view of the semiconductor die 100 in a section plane C-C illustrated in FIG. 13 during different steps of producing the clamping element 4.

Referring to FIG. 17A, the method includes forming a polycrystalline semiconductor layer 400 on top of the barrier layer 220. According to one example, the polycrystalline semiconductor layer 400 is formed to cover the entire surface 221 of the barrier layer 220, so that the polycrystalline semiconductor layer 400 covers the barrier layer 220 in the active regions 110, 120 (not illustrated in FIG. 17A) and the passive region 130. Forming the polycrystalline semiconductor layer 400 may include a deposition process. The polycrystalline semiconductor layer 400 is a polysilicon layer, for example.

Optionally, a protection layer 410 is formed on top of the barrier layer 220 before forming the polycrystalline semiconductor layer 400, so that the protection layer 410 separates the polycrystalline semiconductor layer 400 from the barrier layer 220. According to one example, the protection layer 410 is an oxide layer such as, for example, a silicon oxide layer. According to one example, the silicon oxide layer is a silicon oxide layer that is based on TEOS (tetraethoxysilane).

According to one example, the gate semiconductor layers 241, 242 and gate electrodes 113, 123 (illustrated in FIGS. 14 and 15 and not illustrated in FIG. 17A) have been formed before forming the protection layer 410. In this example, the protection layer 410, in the active regions 110, 120, covers the gate electrodes 113, 123 and the gate semiconductor layers 241, 242. This is illustrated in FIGS. 18 and 19.

Figure 18:
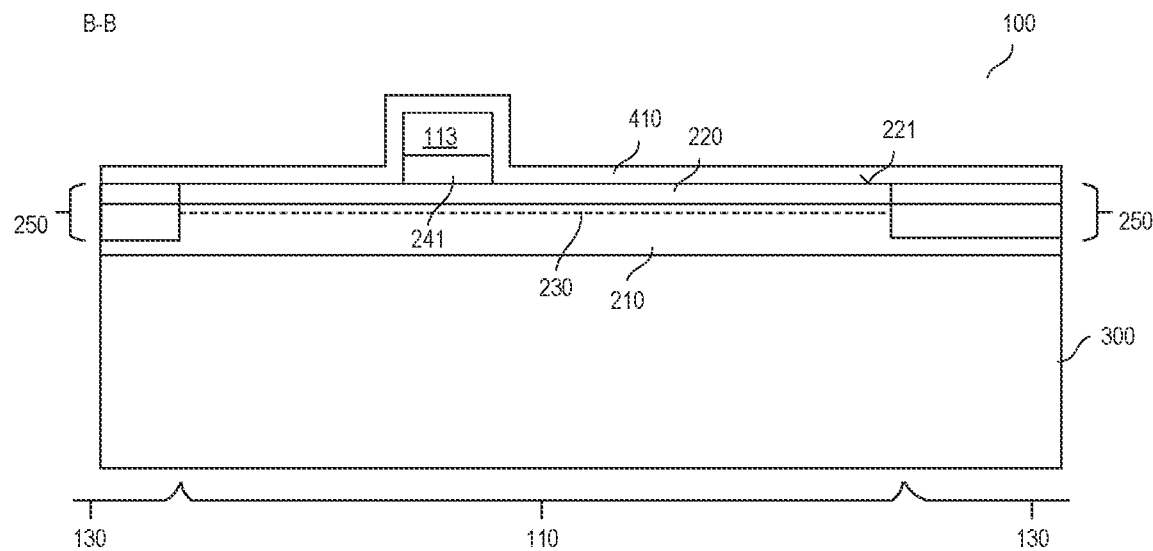
FIGS. 18 and 19 show vertical cross-sectional views of the first transistor device and the second transistor device, respectively, after forming gate semiconductor layers and gate electrodes and after forming a protection layer on top of the gate semiconductor layers and gate electrodes.
Figure 19:
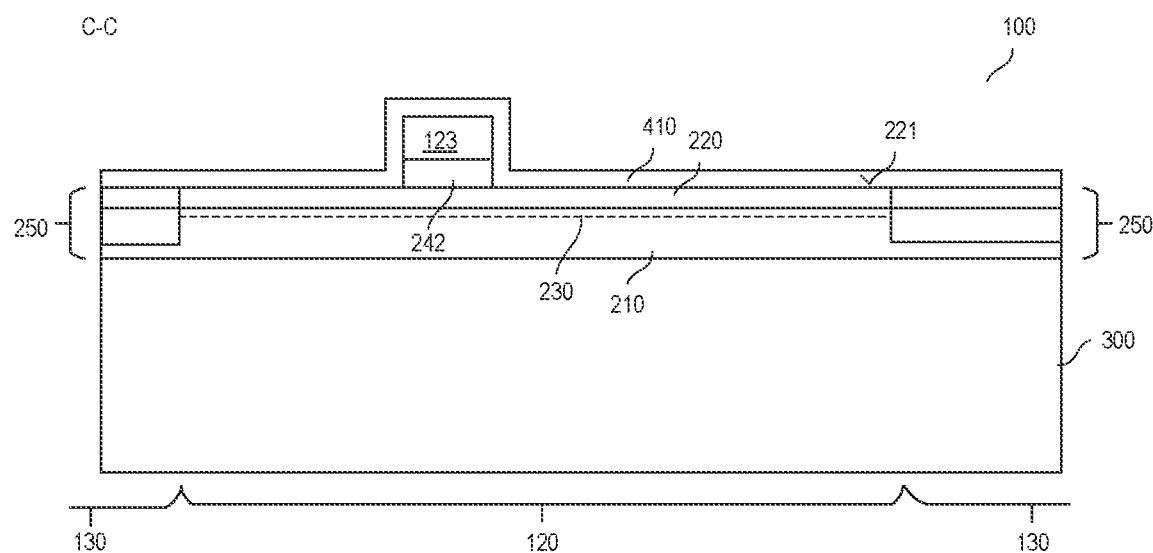

FIGS. 18 and 19 show vertical cross-sectional views of the first and second active regions 110, 120 after forming the gate semiconductor layers 241, 242 and the gate electrodes 113, 123 and depositing the protection layer 410. In the example illustrated in FIGS. 18 and 19, at the time of forming the protection layer 410, the drain and source electrodes 111, 121, 112, 122 have not been formed, yet.

Referring to FIG. 17B, forming the clamping element 4 further includes patterning the polycrystalline semiconductor layer 400 to form the polycrystalline semiconductor layer 40 of the clamping element 4. According to one example, patterning the polycrystalline layer 400 includes forming an etch mask 510 on top of the polycrystalline layer 400 such that the etch mask 510 covers the desired polycrystalline semiconductor layer 40 of the clamping element, and performing an etching process in which those sections of the polycrystalline layer 400 not covered by the etch mask 510 are removed. During the etching process, the protection layer 410 protects the barrier layer 220. Furthermore, in the event that the gate semiconductor layers 241, 242 and gate layers 113, 123 have already been formed before forming the clamping element 4, the protection layer 410 also protects the gate semiconductor layers 241, 242 and the gate layers 113, 123 during the etching process.

The method further includes removing the etch mask 510 and implanting dopant items into the polycrystalline semiconductor layer 40 in order to form first and second doped regions 43, 44 of the type explained hereinabove. The result of these process steps as illustrated in FIG. 17C.

Referring to the above, the first doped regions 43 may have a higher doping concentration than the second doped regions 44. According to one example, forming the polycrystalline semiconductor layer 400 includes forming the polycrystalline semiconductor layer 400 as an intrinsic (or not intentionally doped) layer. In this example, the polycrystalline layer 40, after removing the etch mask 510, is an intrinsic layer. Furthermore, in this example, forming the clamping element 4 may include a blanket first implementation in which dopant atoms of the second doping type are implanted into the entire semiconductor layer 40. In this implantation process, the implantation dose is adapted to the desired implementation dose of the second regions 44 in the finished clamping element 4. According to one example, protection layer 410 is sufficient to prevent dopant atoms from being implanted into barrier layer 220 during this implantation process. According to another example (not illustrated), a further protection layer is formed on top of protection layer 410 in order to prevent dopant atoms from being implanted into the barrier layer 220 during the implantation process.

Furthermore, forming the clamping element 4 may include forming an implantation mask 520 on top of those sections that form the second regions 44 in the finished clamping element 4. Furthermore, in a second implantation process, dopant atoms of the first doping type are implanted into those sections of the polycrystalline layer 40 that are not covered by the implantation mask 520 in order to form the first regions 43. FIG. 17C shows the polycrystalline layer 40 after forming the implantation mask 520 and the implantation process to form the first regions 43.

The implantation dose in the second implantation process is higher than in the first implantation process, so that the first regions 43 have an effective doping concentration of the first doping type. The dopant dose in the second process essentially equals the magnitude of the desired effective doping dose of the first regions 43 plus the magnitude of the first implantation dose.

The order in which the first and second implementation processes are performed is arbitrary. That is, it is also possible to perform the masked second implementation process first and then perform the blanket first implementation process.

Referring to the above, the resistor 5 may include a polycrystalline semiconductor layer 50. This semiconductor layer 50 may be formed based on the polycrystalline semiconductor layer 400 in the same patterning process in which the polycrystalline semiconductor layer 40 of the clamping element 4 is formed. After this patterning process, the polycrystalline layer 50 of the resistor 5 is intrinsic (not intentionally doped). The polycrystalline layer 50 of the resistor 5 may be doped by one of the first and second implementation processes that are used to form the clamping element 4.

According to another example, the polycrystalline layer 50 of the resistor 5 is doped in a third implementation process. In this example, the polycrystalline layer 50 of the resistor 5 is covered during the first and second implementation processes that form the clamping element 4, and the polycrystalline layer 40 of the clamping element 4 is covered during the third implementation process that forms the resistor 5.

Referring to the above, the clamping element 4 may be formed after forming the gate semiconductor layers 241, 242 and the gate electrodes 113, 123. In this example, the drain electrodes 111, 121, the source electrodes 112, 122, and the optional field plates 114, 124 may be formed after forming the clamping element 4 and the resistor 5. Forming these elements may include conventional processes, so that no further explanation is required in this regard. FIG. 5, FIG. 6, and FIG. 7

Figure 20:
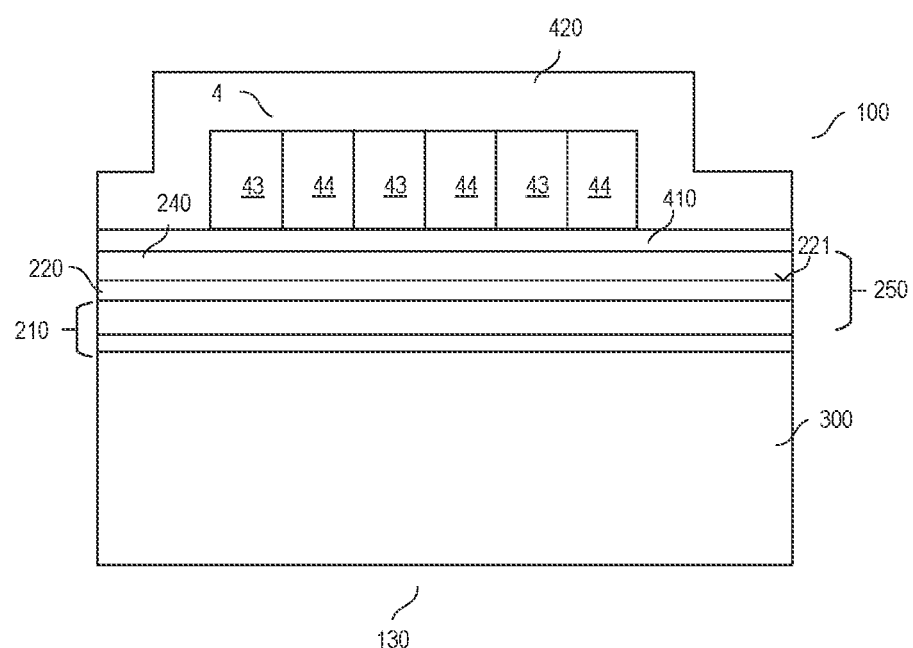
FIG. 20 shows a vertical cross-sectional view of one example of the clamping element after forming a protection layer on top of the clamping element.

According to another example illustrated in FIG. 20, before forming the clamping element 4 and the resistor 5, a III-V semiconductor gate layer 240 is deposited on top of the surface 221 of the barrier layer 220, and the protection layer 410 is formed on top of the III-V gate semiconductor layer 240. The clamping element 4 and the resistor 5 may be formed on top of the protection layer 410 in the same way as explained herein before. FIG. 20 illustrates the finished clamping element 4.

Referring to the above, forming the insulation reaching 130 may include implanting damaging particles into the semiconductor die 100 in order to form a damaged region 250 in the barrier layer 220 and the channel layer 210. In the example illustrated in FIG. 20, the damaged region 250 may be formed after forming the III-V gate semiconductor layer 240, so that the damaged region 250 is formed in the III-V gate semiconductor layer 240, the barrier layer 220, and the channel layer 210.

Based on the III-V gate semiconductor layer 240 the gate semiconductor layers 241, 242 of the first and second transistor devices 1, 2 are formed. According to one example, forming the gate semiconductor layers 241, 242 includes patterning the III-V semiconductor layer 240 in an etching process. In order to protect the clamping element 4 and the resistor 5 from being damaged during this etching process, a further protection layer 420 is formed on top of the clamping element 4 (as illustrated in FIG. 20) and the resistor 5 (not illustrated in FIG. 20). The further protection layer 420 includes an oxide, a nitride, or a combination thereof, for example.

FIGS. 21A-21D illustrate one example of a method for forming the gate semiconductor layer and the gate electrode of one of the first and second transistor devices. Just for the purpose of illustration, FIGS. 21A-21D illustrate forming the gate semiconductor layer 241 and the gate electrode 131 of the first transistor device 1. The same process steps may be used to form the gate semiconductor layer 242 and the gate electrode 132 of the second transistor device 2. Each of FIGS. 21A-21D shows a vertical cross-sectional view of the first active region 110 and of adjoining sections of the passive region 130.

Figure 21A:
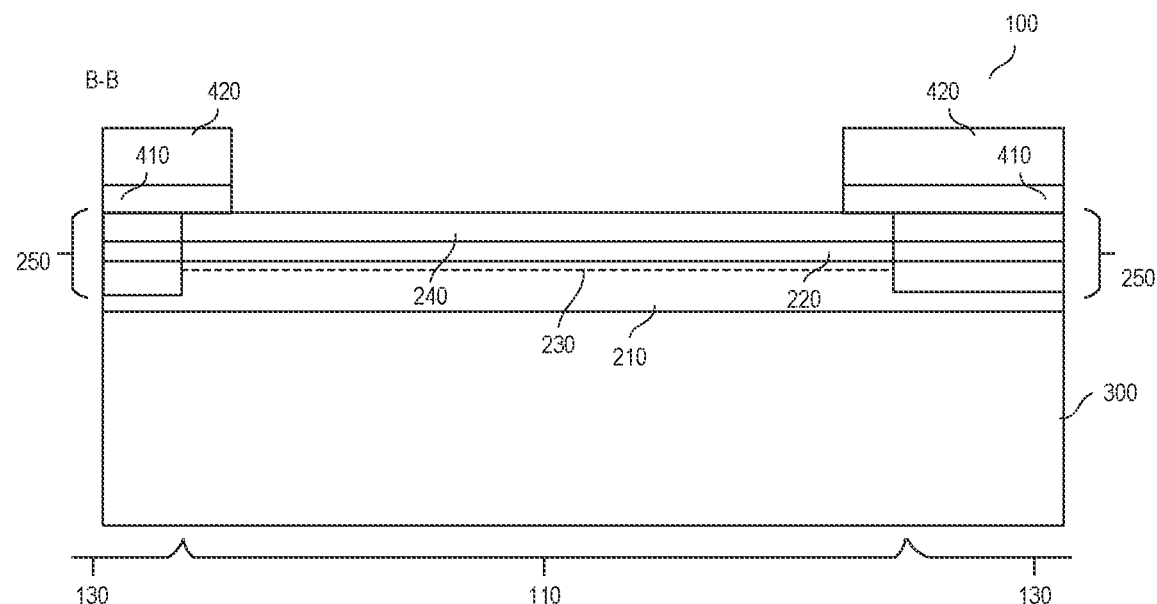
FIGS. 21A-21D illustrate one example of a method for forming a gate semiconductor layer and a gate electrode.

Referring to FIG. 21A, the method includes removing the first and second protection layers 410, 420 in the first active region 110. FIG. 21A shows the first active region 110 after removing the first and second protection layers 410, 420. Removing these protection layers 410, 420 may include an etching process in which an etch mask covers at least those sections of the passive region 130 that include the clamping element 4 and the resistor 5 produced before. In the etching process, the first and second protection layers 410, 420 are removed in those sections not covered by the etch mask. These sections include, in particular, sections where the gate semiconductor layer and the gate electrodes of the first and second transistor devices are to be formed.

Figure 21B:
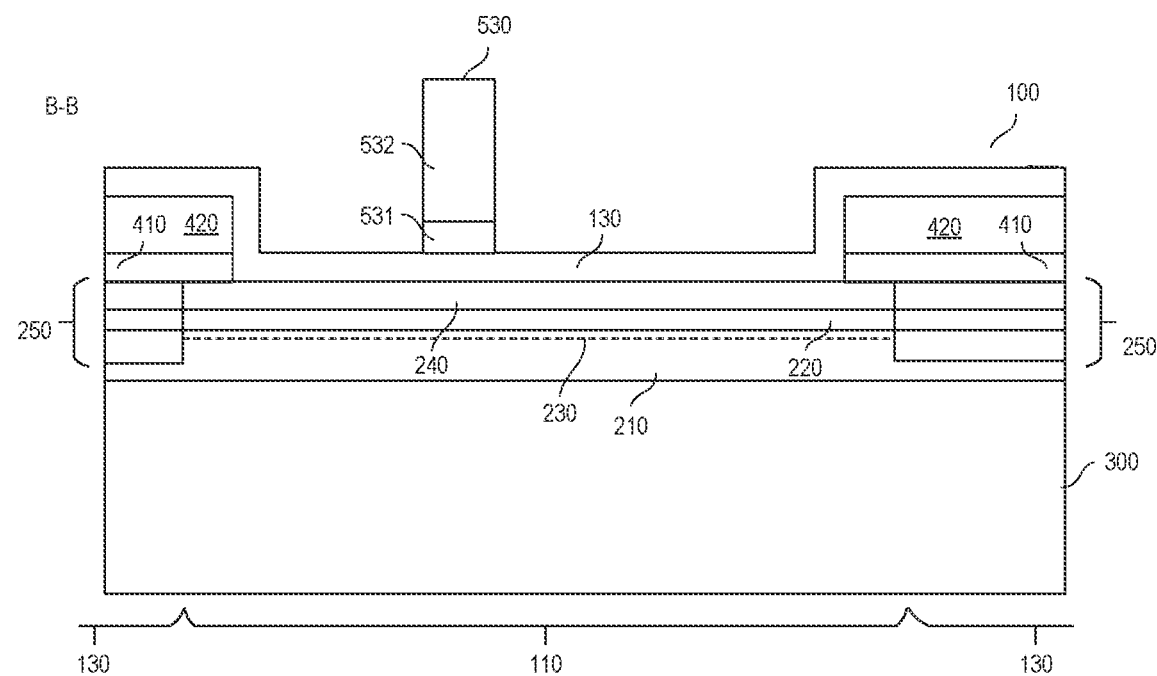

Referring to FIG. 21B, the method further includes forming a gate electrode layer 130. Forming the gate electrode layer 130 may include depositing the gate electrode layer 130 on the entire semiconductor die 100, that is, on the second protection layer 420 and on sections not covered by the first and second protection layers 410, 420. The gate electrode layer 130 is a metal layer, for example.

Referring to FIG. 21B, the method further includes forming an etch mask 530 on top of the gate electrode layer 130. The etch mask 530 defines the position and the size of the gate electrode 131 and the gate semiconductor layer 241 of the finished transistor device. The etch mask 530 may be produced in a conventional way. According to one example, the etch mask 530 includes a hard mask 531 such as, for example, an oxide hard mask, and a resist 532.

Figure 21C:
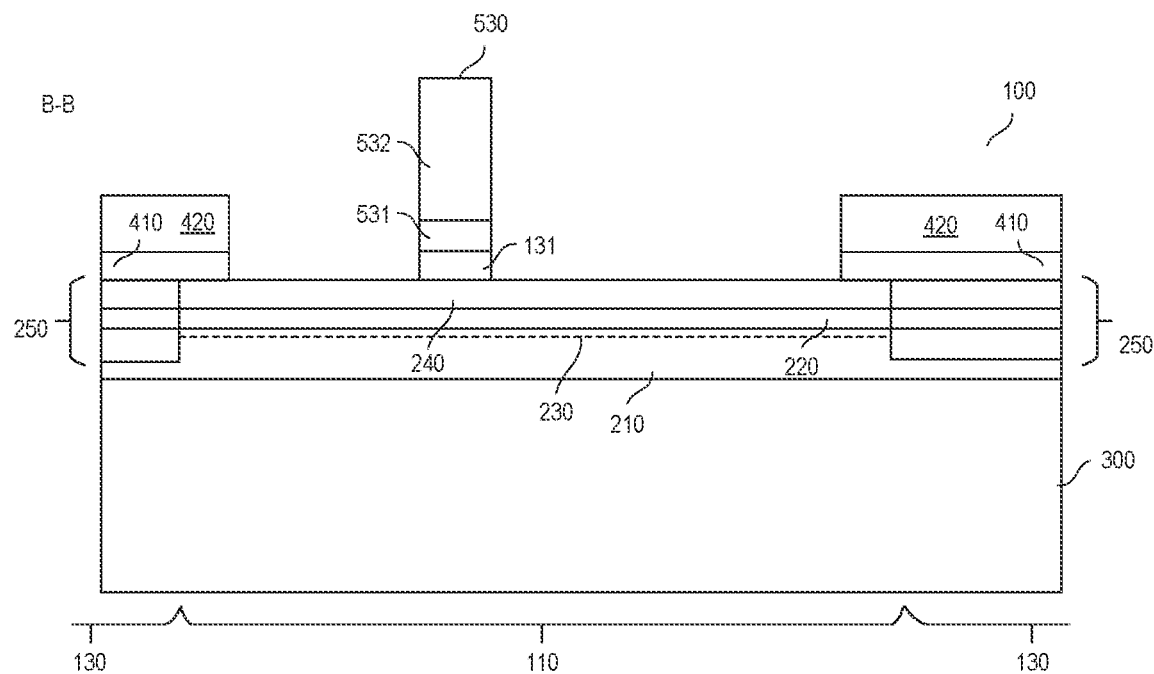
Figure 21D:
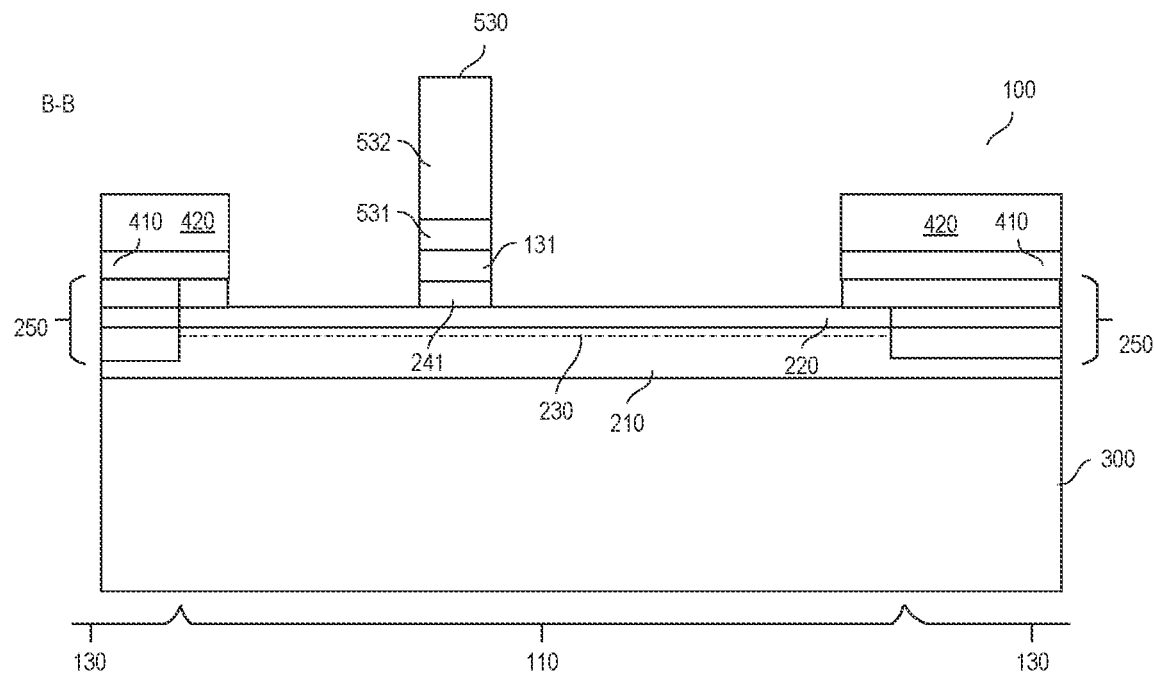

Referring to FIGS. 21C and 21D, forming the gate semiconductor layer 241 based on the III-V semiconductor gate layer 240 and the gate electrode 131 based on the gate electrode layer 130 may include two etching processes, (i) a first etching process in which the gate electrode layer 130 is etched using the etch mask 530 in order to form the first gate electrode 131, and (ii) a second etching process in which the III-V semiconductor gate layer 240 is etched using the etch mask 530 in order to form the gate semiconductor layer 241. FIG. 21C shows the first active region 110 after the first etching process, and FIG. 21D shows the first active region 110 after the second etching process.

Referring to the above, the clamping circuit 6, in addition to the second transistor device 2, the clamping element 4, and the resistor 5, may include further circuit elements such as further resistors, a further transistor device, or a capacitor. The further resistors may be formed in the same way as resistor 5 explained herein above. The further transistor device may be formed in the same way as the first and second transistor devices 1, 2. The capacitor may be formed by the same process that forms the transistor device structures with the gate electrodes 113, 123, the insulation layers 115, 125, and the field plates 114, 124.

Some of the aspects explained above are briefly summarized in the following with reference to numbered examples.

Example 1. An electronic circuit, including: a first transistor device including a load path between a first load path node and a second load path node; and a clamping circuit connected to the load path of the first transistor device, wherein the clamping circuit includes: a second transistor device including a load path connected in parallel with the load path of the first transistor device, and a control node; and a drive circuit configured to drive the second transistor device, wherein the drive circuit includes a clamping element and a resistor connected in series between the first and second load path nodes of the first transistor device, wherein the drive circuit is configured to drive the second transistor device dependent on a voltage across the resistor, and wherein the first transistor device and the clamping circuit are integrated in the same semiconductor die.

Example 2. The electronic circuit of claim 1, wherein a size of the first transistor device is between 80% and 95% of an overall size of the first transistor device and the second transistor device.

Example 3. The electronic circuit of claim 1 or 2, wherein each of the first transistor device and the second transistor device is a HEMT.

Example 4. The electronic circuit of claim 1 or 2, wherein each of the first transistor device and the second transistor device is a MOSFET.

Example 5. The electronic circuit of any one of the preceding claims, wherein the drive circuit further includes a capacitor connected in parallel with the clamping element.

Example 6. The electronic circuit of any one of claims 1 to 5, wherein the resistor is connected between the control node and the second load path node of the second transistor.

Example 7. The electronic circuit of any one of claims 1 to 5, wherein the drive circuit further includes a further transistor, wherein the further transistor is configured to be a driven by the voltage across the resistor and is configured to drive the second transistor device.

Example 8. The electronic circuit of any one of the preceding claims, wherein the control node of the first transistor device is coupled to the control node of the second transistor device.

Example 9. The electronic circuit of claim 8, wherein the control node of the first transistor device is coupled to the control node of the second transistor device by a coupling circuit including a rectifier element.

Example 10. The electronic circuit of any one of claims 1 to 9, wherein the clamping element includes a polysilicon layer with at least one PN junction between complementarily doped polysilicon regions.

Example 11. The electronic circuit of any one of claims 1 to 9, wherein the clamping element includes a plurality of transistors connected in series, wherein each of the transistors includes a gate node and a drain node, and wherein each of the transistors has its drain node connected to its gate node.

Example 12. The electronic circuit of any one of the preceding claims, wherein the clamping circuit further includes a third transistor device including a load path connected in parallel with the load path of the first transistor device, and a control node, and wherein the drive circuit further includes a further resistor connected in series with the resistor and the clamping element between the first and second load path nodes of the first transistor device, and wherein the drive circuit is further configured to drive the third transistor device dependent on a voltage across the further resistor.

Example 13. The electronic circuit of claim 12, wherein the second transistor device is configured to switch on or off dependent on a drive voltage referenced to the second load path node of the first transistor device, and wherein the third transistor device is configured to switch on or off dependent on a drive voltage referenced to the first load path node of the first transistor device.

Example 14. A method, including: integrating an electronic circuit with a first transistor device including a load path between a first load path node and a second load path node, and a clamping circuit connected to the load path of the first transistor device in the same semiconductor die, wherein the clamping circuit includes: a second transistor device including a load path connected in parallel with the load path of the first transistor device, and a control node; and a drive circuit configured to drive the second transistor device, wherein the drive circuit includes a clamping element and a resistor connected in series between the first and second load path nodes of the first transistor device, and wherein the drive circuit is configured to drive the second transistor device dependent on a voltage across the resistor.

Example 15. The method of claim 14, wherein each of the first transistor device and the second transistor device is a HEMT, wherein the first transistor device is formed in a first active region, wherein the second transistor device is formed in a second active region.

Example 16. The method according to claim 15, wherein the clamping element and the resistor are formed in a passive region.

Example 17. The method according to claim 15, wherein the clamping element is formed in one or more further active regions, and wherein the resistor is formed in a passive region.

Example 18. The method of any one of claims 15 to 17, wherein each of the first and second active regions includes a 2DEG.

Example 19. The method of any one of claims 16 to 18, wherein the passive region includes a damaged region and is devoid of a 2DEG.

Example 20. The method of any one of claims 14 to 19, wherein forming each of the first and second transistor devices includes forming a drain electrode, a source electrode, a gate semiconductor layer, and a gate electrode on top of the gate semiconductor layer.

Example 21. The method of claim 20, wherein the clamping element is formed after forming the gate semiconductor layers and the gate electrodes.

Example 22. The method of claim 20, wherein the clamping element is formed before forming the gate electrodes.

What is claimed is:

1. An electronic circuit, comprising:
   a first transistor device comprising a load path between a first load path node and a second load path node; and
   a clamping circuit connected to the load path of the first transistor device, wherein the clamping circuit comprises:
   a second transistor device comprising a load path connected in parallel with the load path of the first transistor device, and a control node; and
   a drive circuit configured to drive the second transistor device,
   wherein the drive circuit comprises a clamping element and a resistor connected in series between the first and second load path nodes of the first transistor device,
   wherein the drive circuit is configured to drive the second transistor device dependent on a voltage across the resistor,
   wherein the clamping circuit further comprises a third transistor device comprising a load path connected in parallel with the load path of the first transistor device, and a control node,
   wherein the drive circuit further comprises a further resistor connected in series with the resistor and the clamping element between the first and second load path nodes of the first transistor device,
   wherein the drive circuit is further configured to drive the third transistor device dependent on a voltage across the further resistor, and
   wherein the first transistor device and the clamping circuit are integrated in a same semiconductor die.

2. The electronic circuit of claim 1, wherein a size of the first transistor device is between 80% and 95% of an overall size of the first transistor device and the second transistor device.

3. The electronic circuit of claim 1, wherein each of the first transistor device and the second transistor device is a HEMT (high electron mobility transistor).

4. The electronic circuit of claim 1, wherein each of the first transistor device and the second transistor device is a MOSFET (metal oxide semiconductor field-effect transistor).

5. The electronic circuit of claim 1, wherein the resistor is connected between the control node and a second load path node of the second transistor.

6. The electronic circuit of claim 1, wherein the drive circuit further comprises a further transistor, wherein the further transistor is configured to be driven by the voltage across the resistor and is configured to drive the second transistor device.

7. The electronic circuit of claim 1, wherein a control node of the first transistor device is coupled to the control node of the second transistor device, such that the second transistor device switches on when a load path voltage of the first transistor device reaches a voltage level higher than a clamping voltage of the clamping element and also switches on when a drive voltage received between the control node and the second load path node of the first transistor device reaches a voltage level that switches on the first transistor device.

8. The electronic circuit of claim 7, wherein the control node of the first transistor device is coupled to the control node of the second transistor device by a coupling circuit comprising a rectifier element.

9. The electronic circuit of claim 1, wherein the clamping element comprises a polysilicon layer with at least one PN junction between complementarily doped polysilicon regions.

10. The electronic circuit of claim 1, wherein the clamping element comprises a plurality of transistors connected in series, wherein each of the transistors of the plurality of transistors comprises a gate node and a drain node, and wherein each of the transistors of the plurality of transistors has the drain node connected to the gate node.

11. A method, comprising:
integrating an electronic circuit with a first transistor device comprising a load path between a first load path node and a second load path node, and a clamping circuit connected to the load path of the first transistor device in a same semiconductor die,
wherein the clamping circuit comprises: a second transistor device comprising a load path connected in parallel with the load path of the first transistor device, and a control node; and a drive circuit configured to drive the second transistor device,
wherein the drive circuit comprises a clamping element and a resistor connected in series between the first and second load path nodes of the first transistor device,
wherein the clamping circuit further comprises a third transistor device comprising a load path connected in parallel with the load path of the first transistor device, and a control node,
wherein the drive circuit further comprises a further resistor connected in series with the resistor and the clamping element between the first and second load path nodes of the first transistor device,
wherein the drive circuit is further configured to drive the third transistor device dependent on a voltage across the further resistor, and
wherein the drive circuit is configured to drive the second transistor device dependent on a voltage across the resistor.

12. The method of claim 11, wherein each of the first transistor device and the second transistor device is a HEMT (high electron mobility transistor), wherein the first transistor device is formed in a first active region, and wherein the second transistor device is formed in a second active region.

13. The method of claim 12, wherein the clamping element and the resistor are formed in a passive region.

14. The method of claim 12, wherein each of the first and second active regions comprises a 2DEG (two-dimensional electron gas).

* * * * *